(12) United States Patent
Fukutome et al.

(10) Patent No.: US 7,977,194 B2
(45) Date of Patent: Jul. 12, 2011

(54) METHOD FOR FABRICATING SEMICONDUCTOR DEVICE WITH FULLY SILICIDED GATE ELECTRODE

(75) Inventors: Hidenobu Fukutome, Kawasaki (JP); Hiroyuki Ohta, Kawasaki (JP); Kazuo Kawamura, Kawasaki (JP); Kimihiko Hosaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 265 days.

(21) Appl. No.: 11/492,199

(22) Filed: Jul. 25, 2006

(65) Prior Publication Data
US 2007/0026595 A1   Feb. 1, 2007

Related U.S. Application Data

(63) Continuation-in-part of application No. 11/337,556, filed on Jan. 24, 2006.

(30) Foreign Application Priority Data

Jul. 26, 2005 (JP) ................... 2005-215479
Jul. 6, 2006  (JP) ................... 2006-186460

(51) Int. Cl.
*H01L 21/8234* (2006.01)

(52) U.S. Cl. ........ 438/275; 438/157; 438/197; 438/283; 257/E21.199; 257/E21.438; 257/E21.622

(58) Field of Classification Search .................. 438/300, 438/275, 197, 283, 157; 257/382, 288, E21.199, 257/E21.438, E21.622
See application file for complete search history.

(56) References Cited

U.S. PATENT DOCUMENTS

| 5,194,749 | A    | 3/1993  | Meguro et al. |
| 6,333,222 | B1 * | 12/2001 | Kitazawa et al. ............. 438/241 |
| 6,562,718 | B1   | 5/2003  | Xiang |
| 6,603,172 | B1 * | 8/2003  | Segawa et al. ................ 257/328 |
| 6,727,146 | B2 * | 4/2004  | Murakami et al. ............ 438/275 |

(Continued)

FOREIGN PATENT DOCUMENTS

| CN | 1445838    |   | 10/2003 |
| JP | 8-213612 A |   | 8/1996  |
| JP | 2004-315211 | * | 10/2004 |

OTHER PUBLICATIONS

Office Action—mailed by the State Intellectual Property Office of the People's Republic of China in connection with corresponding CN patent application No. 2006100092136, on Jul. 25, 2008.

(Continued)

*Primary Examiner* — Thanh V Pham
*Assistant Examiner* — Duy T Nguyen
(74) *Attorney, Agent, or Firm* — Fujitsu Patent Center

(57) ABSTRACT

A method for fabricating a semiconductor device includes the steps of: forming a first MISFET including first source/drain regions and a first gate electrode of a polycrystalline silicon, and a second MISFET including second source/drain regions and a second gate electrode of a polycrystalline silicon and having a gate length larger than that of the first gate electrode; and substituting the polycrystalline silicon forming the first and the second gate electrodes with a metal silicide. In the step of substituting the polycrystalline silicon with the metal silicide, the polycrystalline silicon forming the first gate electrode is totally substituted with the metal silicide and a part of polycrystalline silicon forming the second gate electrode is substituted with the metal silicide by utilizing that the gate length of the second gate electrode is larger than the gate length of the first gate electrode.

13 Claims, 22 Drawing Sheets

U.S. PATENT DOCUMENTS

| | | | |
|---|---|---|---|
| 6,929,992 B1* | 8/2005 | Djomehri et al. | 438/199 |
| 7,176,530 B1* | 2/2007 | Bulucea et al. | 257/369 |
| 2002/0153573 A1* | 10/2002 | Mogami | 257/369 |
| 2003/0146458 A1* | 8/2003 | Horiuchi et al. | 257/288 |
| 2003/0162341 A1* | 8/2003 | Raebiger et al. | 438/197 |
| 2003/0181005 A1* | 9/2003 | Hachimine et al. | 438/231 |
| 2003/0183877 A1* | 10/2003 | Yagishita et al. | 257/347 |
| 2004/0038435 A1* | 2/2004 | Wieczorek et al. | 438/13 |
| 2004/0232494 A1* | 11/2004 | Nagano et al. | 257/382 |
| 2005/0156208 A1* | 7/2005 | Lin et al. | 257/288 |
| 2005/0253204 A1* | 11/2005 | Chan et al. | 257/412 |
| 2006/0094196 A1* | 5/2006 | Kim | 438/305 |
| 2006/0102962 A1* | 5/2006 | Saito | 257/377 |
| 2006/0267106 A1* | 11/2006 | Chao et al. | 257/382 |

OTHER PUBLICATIONS

Second Office Action, issued by the State Intellectual Property Office of the People's Republic of China, in connection with corresponding CN application No. 200610009213.6, on Feb. 5, 2010. English-language translation provided.

* cited by examiner

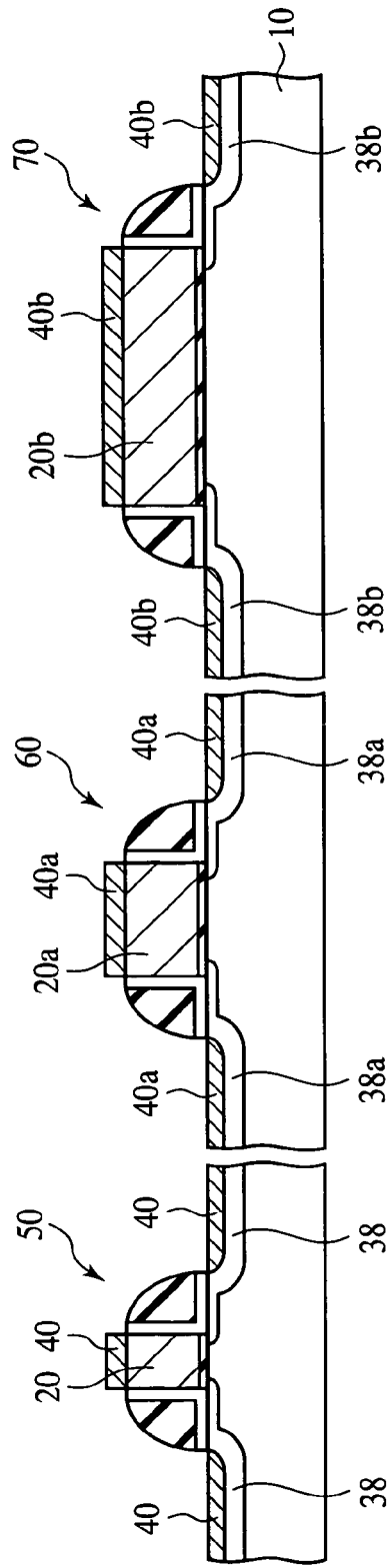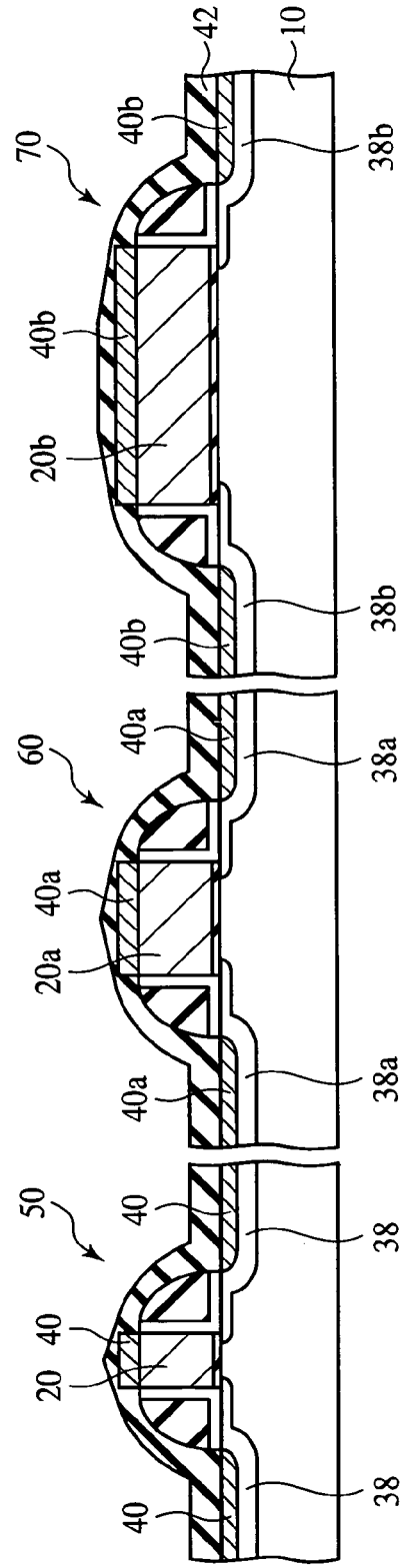

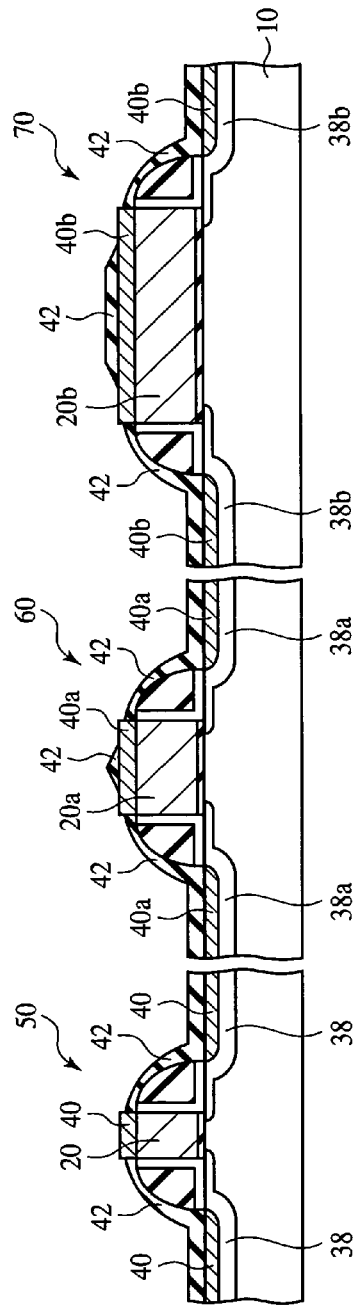
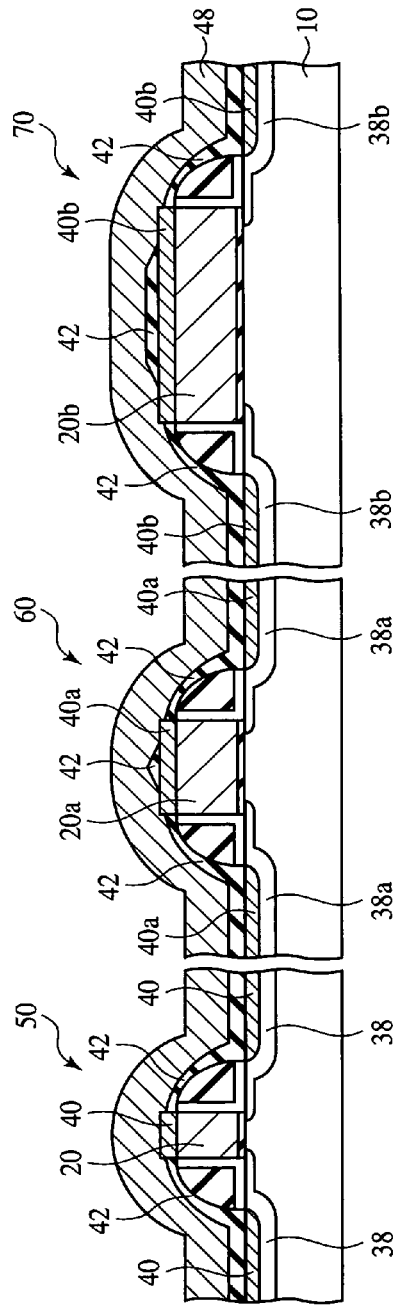

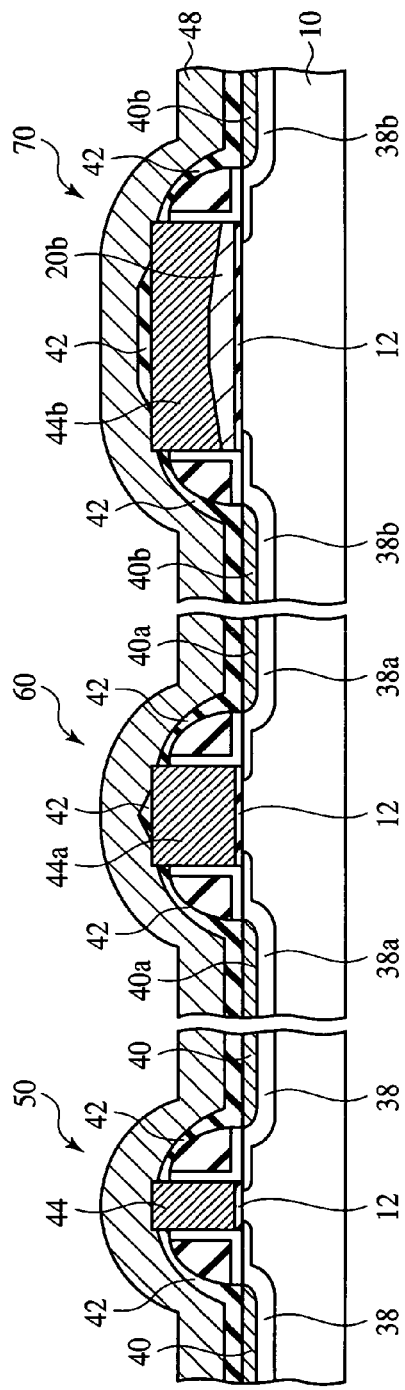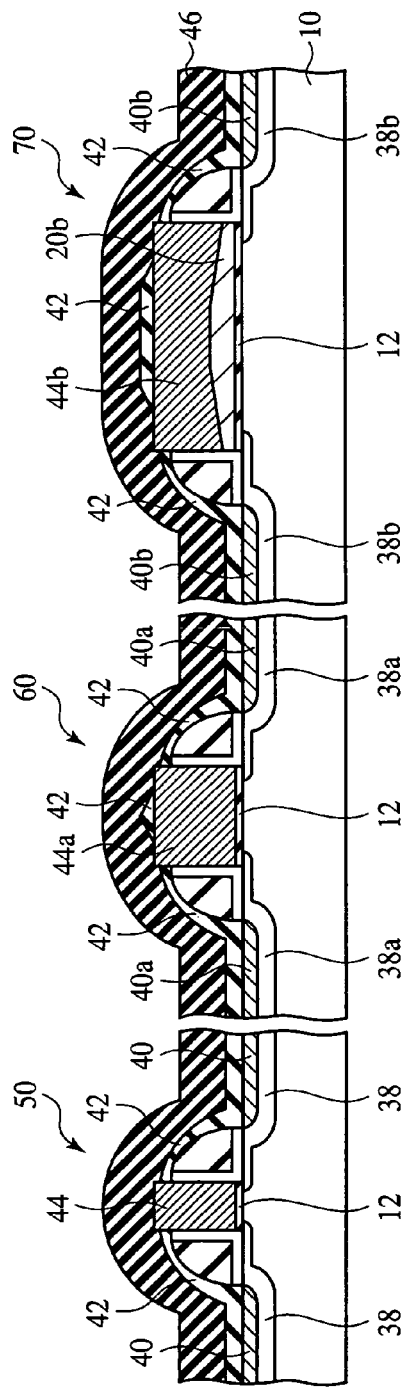

METHOD FOR FABRICATING SEMICONDUCTOR DEVICE WITH FULLY SILICIDED GATE ELECTRODE

CROSS REFERENCE TO RELATED APPLICATIONS

This application is a continuation-in-part of Ser. No. 11/337,556, filed Jan. 24, 2006.

This application is based upon and claims the benefit of priorities from the prior Japanese Patent Application No. 2005-215479, filed on Jul. 26, 2005, and the prior Japanese Patent Application No. 2006-186460, filed on Jul. 6, 2006, the entire contents of which are incorporated herein by reference.

BACKGROUND OF THE INVENTION

The present invention relates to a semiconductor device and a method for fabricating the same, more specifically, a semiconductor device including a gate electrode of metal silicide and a method for fabricating the semiconductor device.

In order to improve the characteristics of MISFET devices, techniques of forming the gate electrode of only metal silicide are proposed. The gate electrode formed of metal silicide alone can decrease the gate resistance in comparison to a gate electrode of the polycide structure and can also suppress the depletion of the gate electrode.

As a technique of forming the gate electrode of only metal silicide, it has been proposed that a dummy electrode of amorphous silicon or polycrystalline silicon is formed at the part where the gate electrode is to be formed, a metal is deposited, and thermal processing for the silicidation reaction is made to substitute the dummy electrode into the metal silicide. This technique retains the consistency with the conventional process of forming the source/drain regions by self-alignment with the gate electrode while keeping off the contamination, etc. of the silicon substrate with the metal material.

Otherwise, it is known that tensile strains exerted to the silicon crystal improve the mobility of the electrons in the crystals, and semiconductor device structures utilizing this feature are proposed. A known example of these structures is a film for applying stress called a stressor film which is formed to cover the gate electrode. As the stressor film, silicon nitride-based insulating films, such as silicon nitride film, silicon oxynitride film, etc., are predominantly used. A stressor film having tensile stress is formed over the gate electrode from the side wall thereof onto the upper surface thereof, whereby the tensile strain is applied to the channel region, and the mobility of the electrons in the channel region is improved. Thus, the MIS transistor can be operated at high speed.

However, the present inventors discovered that when a gate electrode of metal silicide is formed by the above-described technique, it is difficult to induce lattice strain into the channel region by the use of a stressor film.

In the technique of replacing the dummy electrode by metal silicide, an inter-layer insulating film is formed, covering the dummy electrode, the surface of the inter-layer insulating film is planarized to expose an upper surface of the dummy electrode by the CMP (Chemical Mechanical Polishing) method or others, then a metal film is deposited, and thermal processing for silicidizing the metal film is made to thereby substitute the dummy electrode into the metal silicide.

Accordingly, even when the stressor film is formed over the dummy electrode from the side wall onto the upper surface, the stressor film on the upper surface of the dummy electrode is removed in the step of planarizing the inter-layer insulating film, and the tensile stress cannot be applied to the channel region.

SUMMARY OF THE INVENTION

An object of the present invention is to provide a semiconductor device which permits the gate electrode to be formed of metal silicide and a stressor film to be formed over the gate electrode, and a method for fabricating the semiconductor device.

Another object of the present invention is to provide a method for fabricating a semiconductor device and a method for designing a semiconductor device which can selectively and stably silicidize the gate electrodes of MISFETs which must include metal silicide.

According to one aspect of the present invention, there is provided a method for fabricating a semiconductor device comprising the steps of: forming over a semiconductor substrate a first MISFET including first source/drain regions formed in the semiconductor substrate with a first channel region between them, and a first gate electrode of a polycrystalline silicon formed over the first channel region with a first gate insulation film interposed therebetween, and a second MISFET including second source/drain regions formed in the semiconductor substrate with a second channel region between them, and a second gate electrode formed over the second channel region with a second gate insulation film interposed therebetween, formed of a polycrystalline silicon and having a gate length larger than a gate length of the first gate electrode; forming over the semiconductor substrate with the first MISFET and the second MISFET formed on a first insulating film which is thin on upper ends of the first gate electrode and the second gate electrode and is thick on the first source/drain regions and the second source/drain regions; etching the first insulation film, being left on the first source/drain regions and the second source/drain regions and exposing at least the upper ends of the first gate electrode and the second gate electrode; and depositing a metal film and making a thermal processing to substitute the polycrystalline silicon forming the first gate electrode and the polycrystalline silicon forming the second gate electrode with a metal silicide, in the step of substituting the polycrystalline silicon with the metal silicide, the polycrystalline silicon forming the first gate electrode being totally substituted with the metal silicide and a part of polycrystalline silicon forming the second gate electrode being substituted with the metal silicide by utilizing that the gate length of the second gate electrode is larger than the gate length of the first gate electrode.

According to another aspect of the present invention, there is provided a method for designing a semiconductor device including a first MISFET having a first gate electrode of a metal silicide and a second MISFET having a second gate electrode of a polycide structure, a maximum gate length which allows a gate electrode of a metal silicide to be stably formed and a minimum gate length which allows a gate electrode of a polycide structure to be stably formed being defined, a gate length of the first gate electrode being designed to be a size of not more than the maximum gate length, and a gate length of the second gate electrode being designed to be a size of not less than the minimum gate length, and a gate length between the maximum gate length and the minimum gate length being prohibited to be used.

According to the present invention, the pattern dependency of the deposited film thickness in depositing the insulating film is utilized to form the insulating film with the upper end of the gate electrode selectively exposed, and the substitution of the polycrystalline silicon forming the gate electrode with metal silicide is started from the upper end, whereby the MISFET having a short gate length can have all the gate electrode substituted with the metal silicide, and the MISFET having a long gate length can have a part of the gate electrode substituted with the metal silicide.

In the step of the silicidation reaction for substituting the gate electrode with the metal silicide, a maximum gate length which allows the gate electrode to be stably and completely silicidized and a minimum gate length which allow the gate electrode to stably have the polycide structure are defined, and MISFETs having gate length which are between the maximum gate length and the minimum gate length are prohibited to be used, whereby without additional masks, the MISFETs having the completely silicidized gate electrode and the MISFETs having the polycide structure gate electrode can be stably formed.

The stressor film, which is formed after the gate electrode has been substituted into the metal silicide, is formed over the gate electrode from the side wall thereof onto the upper surface thereof, whereby the stressor film can apply a required stress to the channel region. Accordingly, the gate electrode can have lower gate resistance in comparison with the gate electrode of the polycide structure, and the depletion of the gate electrode can be prevented. A required stress can be applied to the channel region by the stressor film, and the mobility of carriers in the channel can be improved. Thus, the MISFET can be operated at high speed.

BRIEF DESCRIPTION OF THE DRAWINGS

FIGS. 18A-18B, 19A-19B and 20A-20B are sectional views of the semiconductor device according to the third embodiment of the present invention in the steps of the method for fabricating the same.

DETAILED DESCRIPTION OF THE PREFERRED EMBODIMENTS

The semiconductor device and method for fabricating the same according to a first embodiment of the present invention will be explained with reference to FIGS. 1 to 13.

Figure 1:
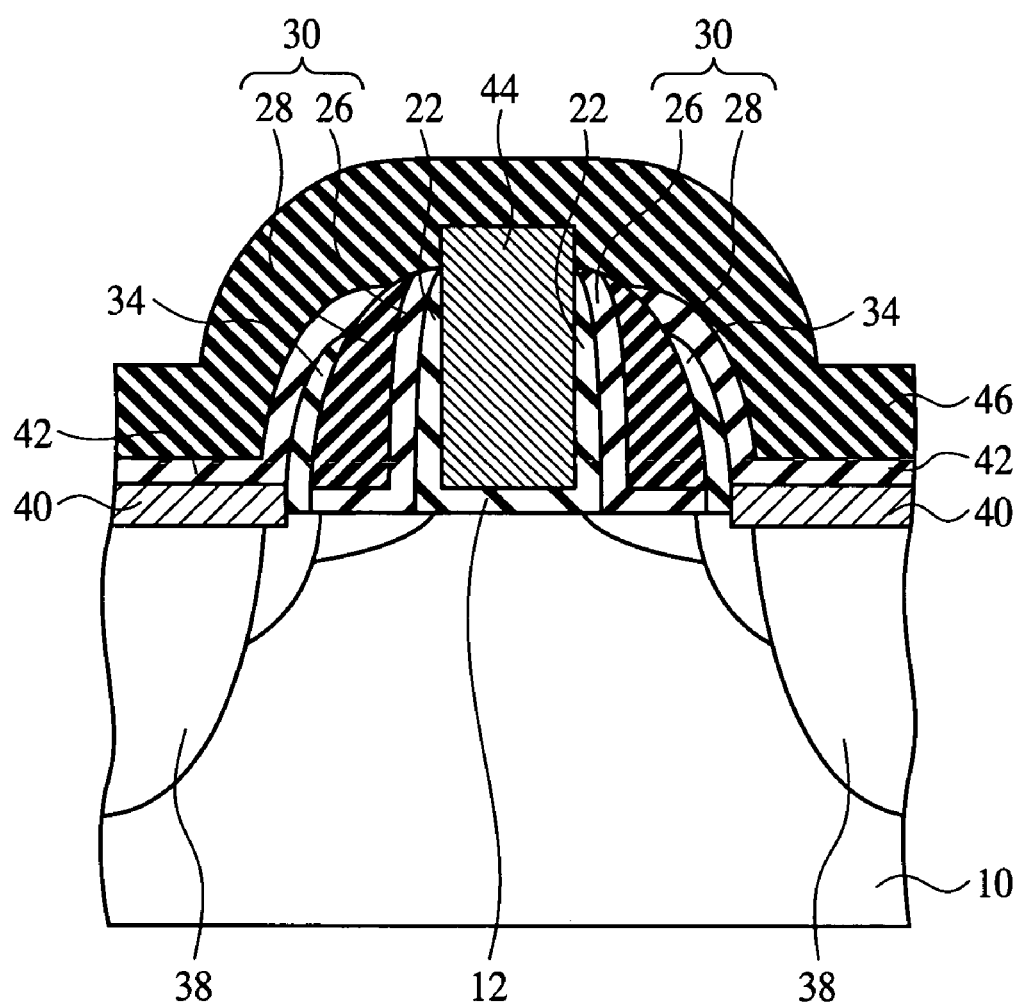
FIG. 1 is a diagrammatic sectional view of the semiconductor device according to a first embodiment of the present invention.
Figure 8A:
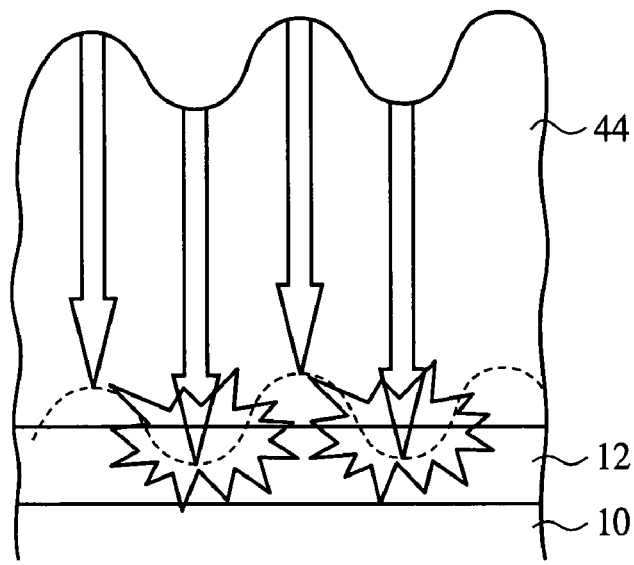
FIGS. 8A and 8B are views explaining the effect produced by planarizing the surface of the polycrystalline silicon film to be the gate electrode.
Figure 8B:
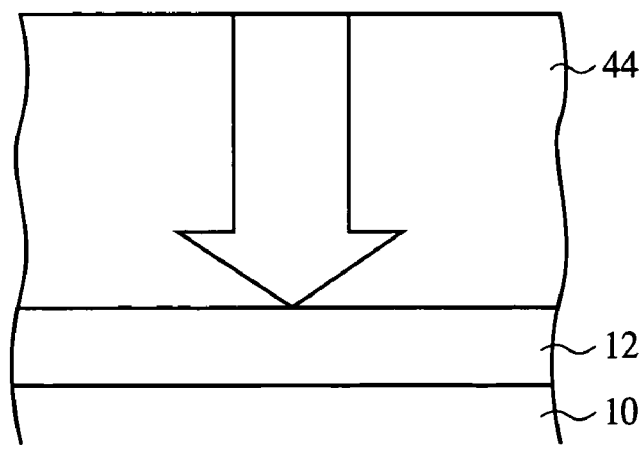
Figure 9:
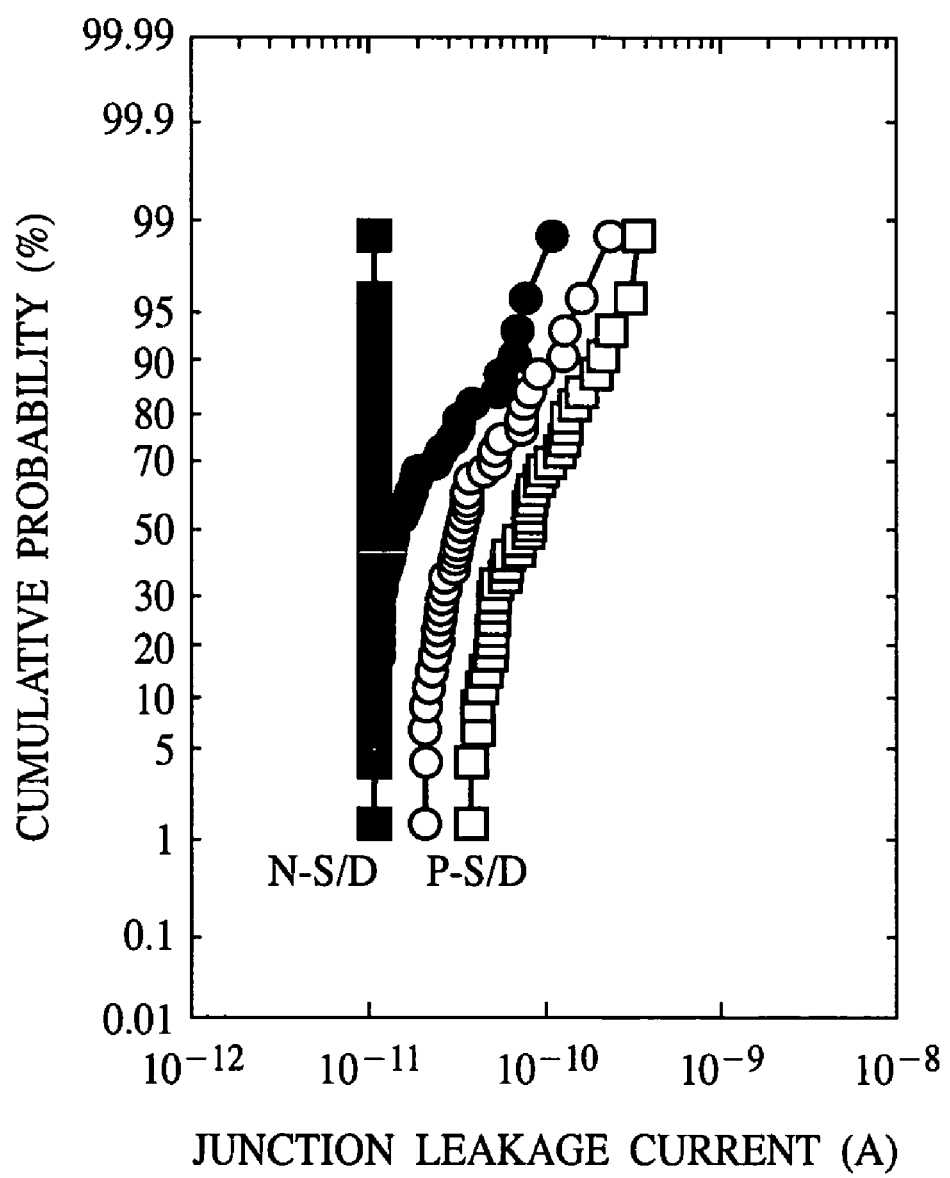
FIG. 9 is a graph showing the cumulative frequency distributions of the junction leak current of the source/drain regions of the MISFETs of the semiconductor device according to the first embodiment of the present invention.
Figure 10:
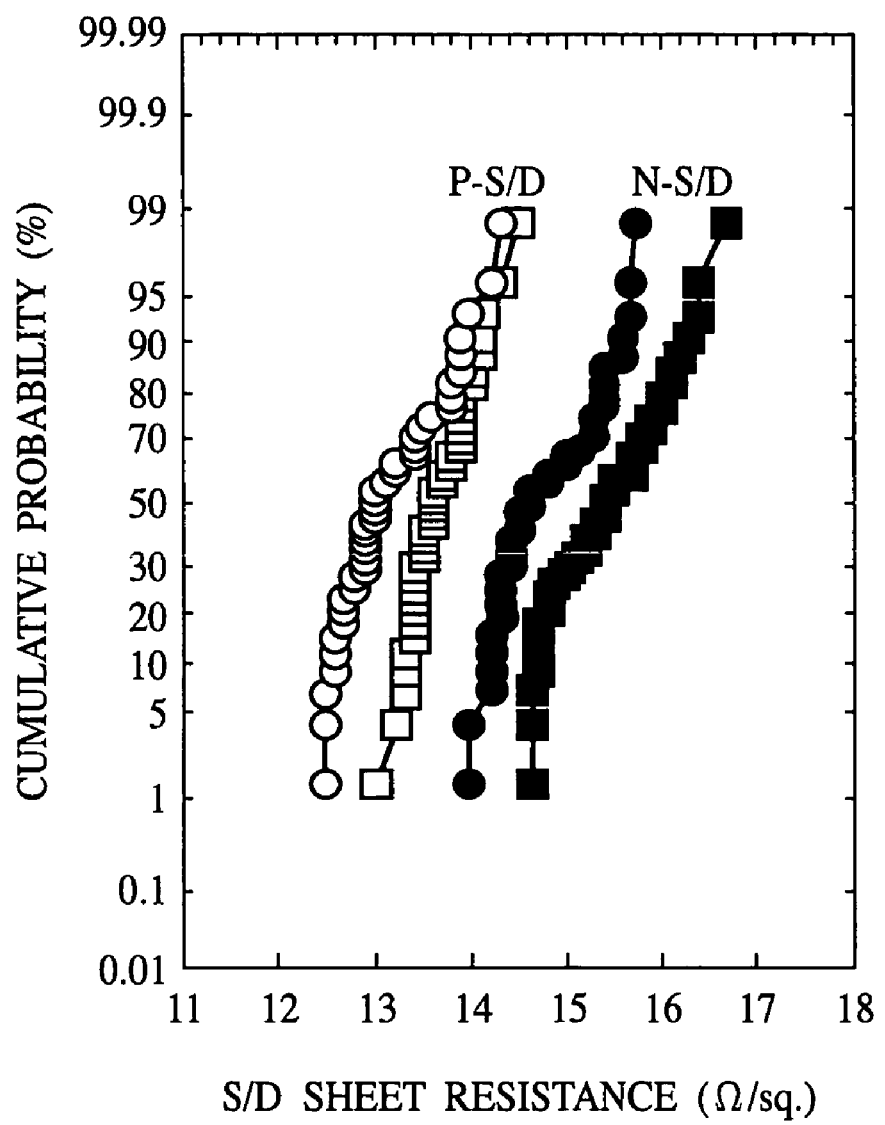
FIG. 10 is a graph showing the cumulative frequency distributions of the sheet resistance of the source/drain regions of the MISFETs of the semiconductor device according to the first embodiment of the present invention.
Figure 11:
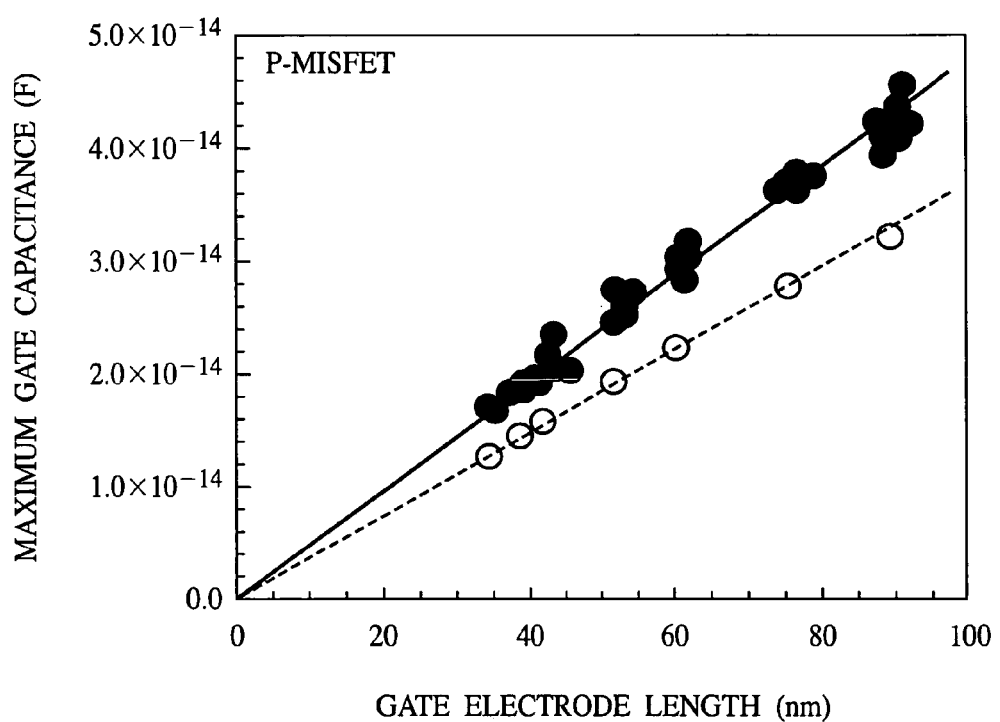
FIG. 11 is a graph showing the relationship between the maximum gate capacitance and the gate electrode length of the MISFETs of the semiconductor device according to the first embodiment of the present invention.
Figure 12:
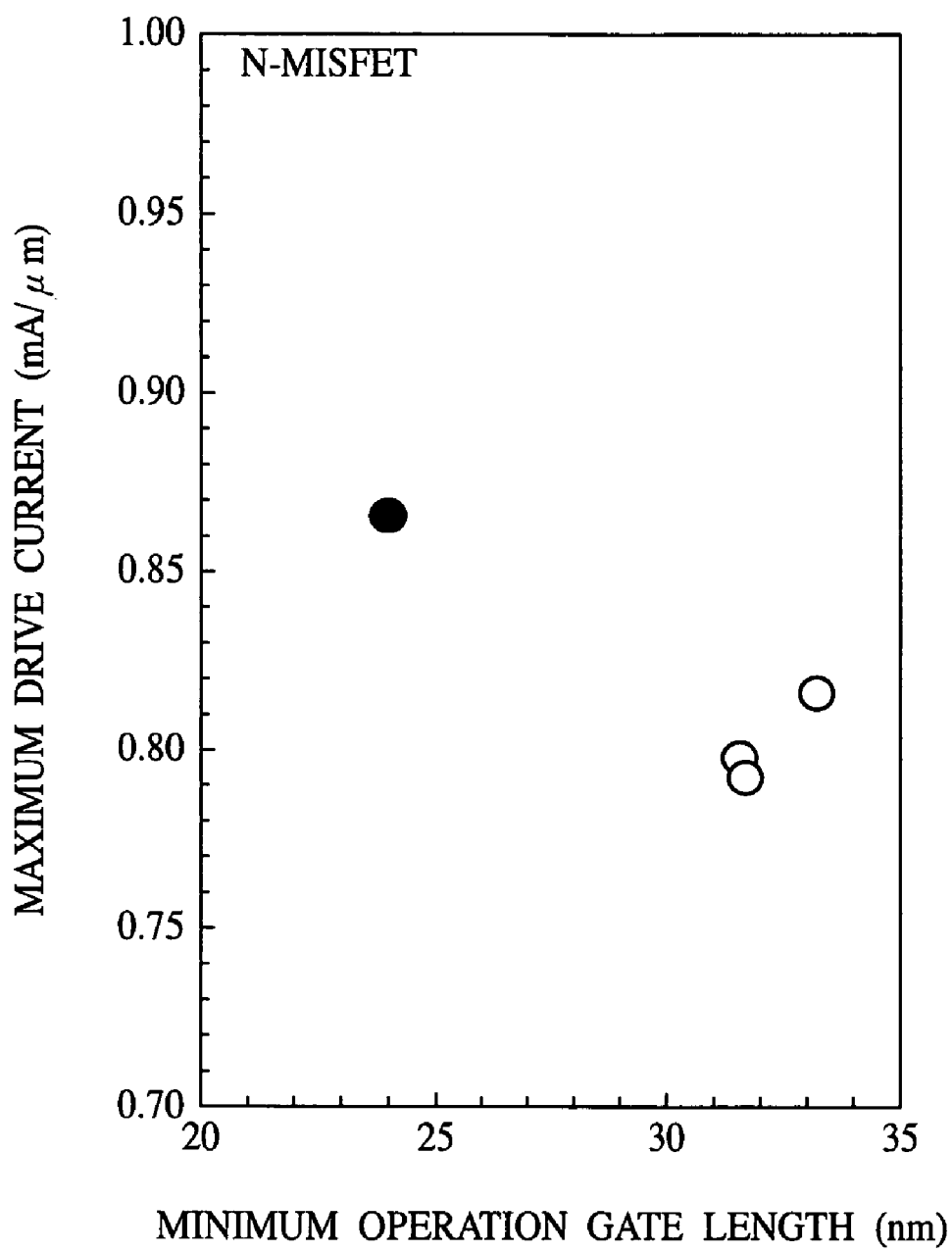
FIG. 12 is a graph showing the relationship between the maximum drive current and the minimum operation gate length at which the MISFET operates of the n-channel MISFET of the semiconductor device according to the first embodiment of the present invention.
Figure 13:
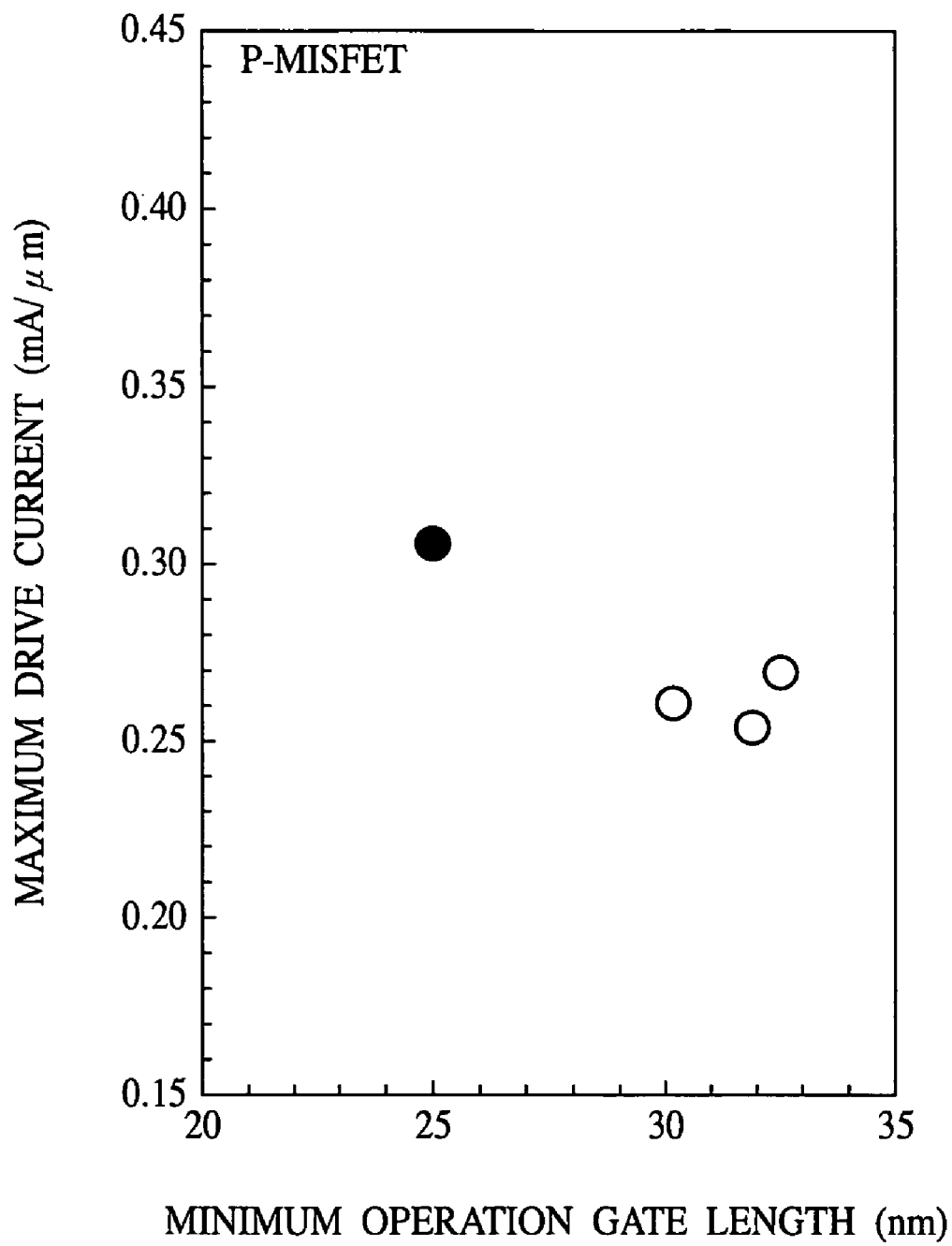
FIG. 13 is a graph showing the relationship between the maximum drive current and the minimum operation gate length at which the MISFET operates of the p-channel MISFET of the semiconductor device according to the first embodiment of the present invention.

FIG. 1 is a diagrammatic sectional view of the semiconductor device according to the present embodiment, which shows a structure thereof. FIGS. 2A to 7B are sectional views of the semiconductor device according to the present embodiment in the steps of the method for fabricating the same, which show the method. FIGS. 8A and 8B are views explaining the effect of planarizing the surface of a polycrystalline silicon film to be a gate electrode. FIG. 9 is a graph showing the cumulative frequency distributions of the junction leak current of the source/drain regions of the MISFETs of the semiconductor device according to the present embodiment. FIG. 10 is a graph showing the cumulative frequency distributions of the sheet resistance of the source/drain regions of the MISFETs of the semiconductor device according to the present embodiment. FIG. 11 is a graph showing the relationship between the maximum gate capacitance and the gate electrode length of the MISFETs of the semiconductor device according to the present embodiment. FIG. 12 is a graph showing the relationship between the maximum drive current and the minimum operation gate length at which the MISFET operates of the n-channel MISFET of the semiconductor device according to the present embodiment. FIG. 13 is a graph showing the relationship between the maximum drive current and the minimum operation gate length at which the MISFET operates of the p-channel MISFET of the semiconductor device according to the present embodiment.

First, the structure of the semiconductor device according to the present embodiment will be explained with reference to FIG. 1.

On a silicon substrate 10, a gate electrode 44 of nickel silicide is formed with a gate insulating film 12 interposed therebetween. A sidewall insulating film 22 of a silicon oxide film, a sidewall insulating film 30 formed of a silicon oxide film 26 and a silicon nitride film 28, and a sidewall insulating film 34 of a silicon oxide film are formed on the side walls of the gate electrode 44.

Source/drain regions 38 having the extension structure are formed in the surface of the silicon substrate 10 on both sides of the gate electrode 44. A nickel silicide film 40 is formed on the source/drain regions 38. A silicon oxide film 42 is formed on the nickel silicide film 40.

A stressor film 46 of silicon nitride film is formed over the gate electrode from the side walls thereof onto the upper part thereof with the sidewall insulating films 22, 30, 34 interposed therebetween. The stressor film 46 is a film which applies tensile stress or compression stress to the channel region of the MISFET. To this end, the stressor film 46 must be formed over the entire gate electrode 44 from the side walls thereof onto the upper surface thereof. When the stressor film 46 is formed above the upper surface of the gate electrode 44, sufficient stress cannot be applied to the channel region.

As described above, the semiconductor device according to the present embodiment is characterized mainly in that the gate electrode 44 is formed of metal silicide, and the stressor film 46 is formed over the gate electrode 44 from the side walls thereof onto the upper surface thereof.

The stressor film 46 is for applying stress to the channel region of the MISFET. When the MISFET is n-type, the stressor film has a tensile stress of, e.g., from 1.0 to 2.0 GPa, and when the MISFET is p-type, the stressor film has a compression stress of, e.g. from 1.0 to 3.0 GPa.

The film having a tensile stress means a film which applies the stress to the substrate in the direction of straining the substrate. That is, when the stressor film of a tensile stress is formed over the silicon substrate, the stress is applied in the direction of straining the silicon crystals. Oppositely, the film having a compression stress means a film which applies a stress to the substrate in the direction of compressing the substrate. That is, when the stressor film having a compression stress is formed over the silicon substrate, the stress is applied in the direction of compressing the substrate. When the stress is applied to the silicon crystal, and a strain is generated, the symmetry of the isotropic band structure of the silicon crystal is broken, and energy level split takes place. Because of the band structure variation, the carrier scattering due to the lattice vibrations is decreased, and the effective mass is decreased, whereby the mobility of the carriers can be improved.

Thus, the semiconductor device is thus constituted, whereby the gate resistance can be decreased in comparison with the semiconductor device including the gate electrode of the polycide structure, and the depletion of the gate electrode can be prevented. The stressor film 46 can apply a required stress to the channel region, whereby the mobility of the carrier in the channel region can be improved. Thus, the MISFET can be operated at high speed.

Next, the method for fabricating the semiconductor device according to the present embodiment will be explained with reference to FIGS. 2A to 8B.

First, a 1.5 nm-thick silicon oxide film, for example, is formed on a silicon substrate 10 by, e.g., thermal oxidation method. Thus, the gate insulating film 12 of the silicon oxide film is formed. The gate insulating film 12 can be other insulating films, e.g., a silicon oxynitride film.

Figure 2A:
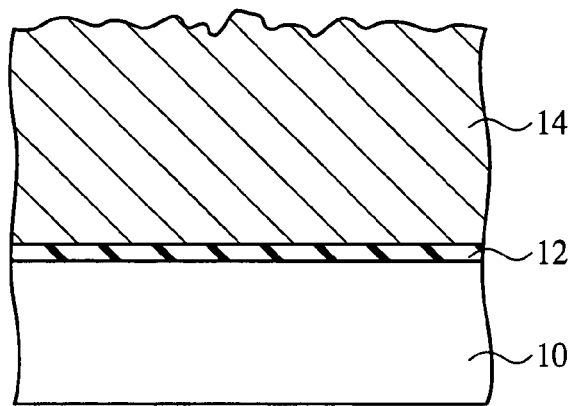
FIGS. 2A-2C, 3A-3C, 4A-4C, 5A-5B, 6A-6B, and 7A-7B showing sectional views of the semiconductor device according to the first embodiment according to the present invention in the steps of the method for fabricating the same.

Then, a 100 nm-thick polycrystalline silicon film 14, for example, is deposited on the gate insulating film 12 by, e.g., CVD method. Concavities and convexities reflecting configurations of the grown grains are present in the surface of the polycrystalline silicon film 14 formed by CVD method (FIG. 2A). In place of polycrystalline silicon film, amorphous silicon film may be deposited.

Figure 2B:
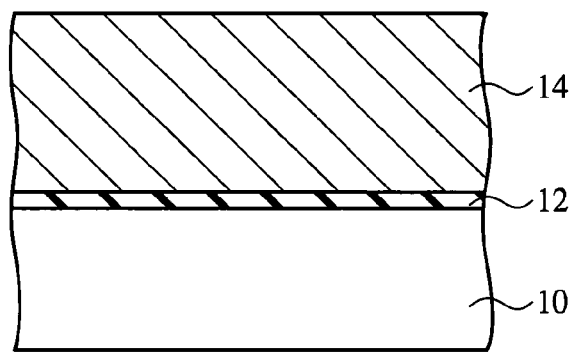
Figure 2C:
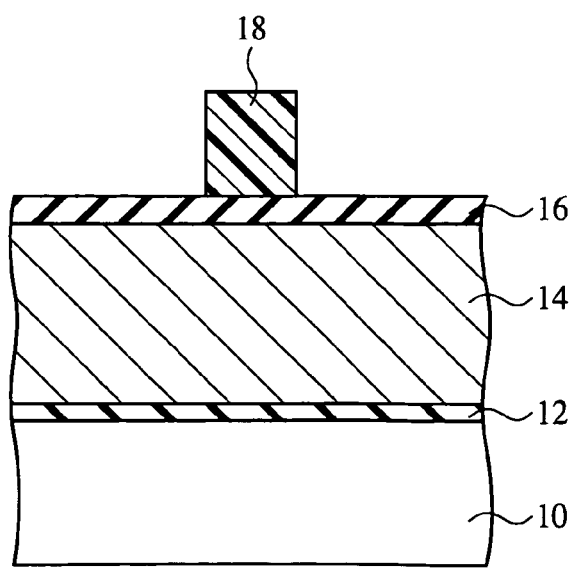

Next, the surface of the polycrystalline silicon film 14 is polished flat by, e.g., CMP method (FIG. 2B).

Next, on the planarized polycrystalline silicon film 14, a 30 nm-thick silicon oxide film 16 is deposited by, e.g., CVD method.

Next, on the silicon oxide film 16, a photoresist film 18 having a pattern of the gate electrode to be formed is formed by photolithography.

Figure 3A:
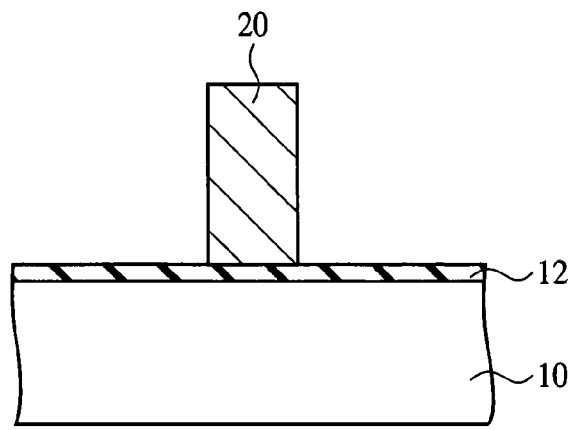

Next, with the photoresist film 18 as the mask, the silicon oxide film 16 and the polycrystalline silicon film 14 are anisotropically etched to form the gate electrode 20 as a dummy electrode of the polycrystalline silicon film 14 (FIG. 3A). At this time, the silicon oxide film 16 is to be the hard mask for patterning the polycrystalline silicon film 14.

Then, the photoresist film 18 is removed by, e.g., ashing, and the silicon oxide film 16 is removed by, e.g., wet etching.

Figure 3B:
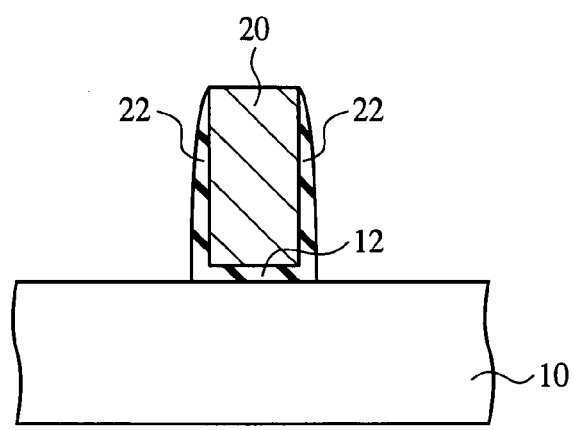

Next, a silicon oxide film of, e.g., 10 nm-thick is deposited by CVD method and etched back to form the sidewall insulating films 22 of the silicon oxide film on the side surfaces of the gate electrode 20 (FIG. 3B).

Figure 3C:
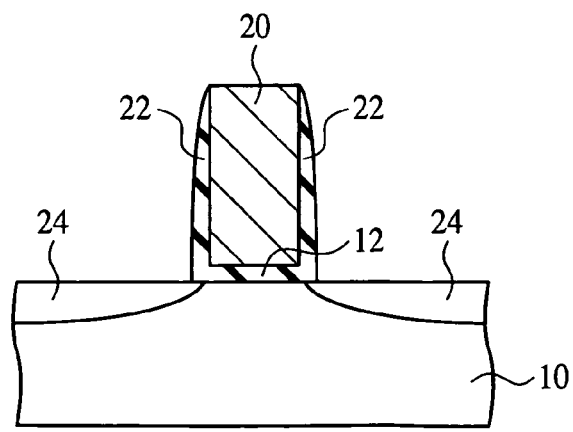

Then, with the gate electrode 20 and the sidewall insulating film 22 as the mask, impurity ions are implanted to form in the silicon substrate 10 on both sides of the gate electrode 20 impurity regions 24 to be the extension regions (FIG. 3C).

Figure 4A:
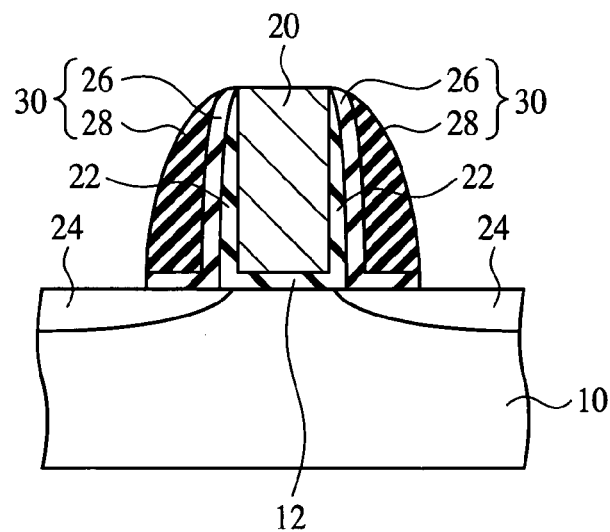

Next, a silicon oxide film 26 of, e.g., a 10 nm-thickness and a silicon nitride film 28 of, e.g., a 30 nm-thickness are deposited by CVD method and etched back to form the sidewall insulating films 30 from the silicon oxide film 26 and the silicon nitride film 28 on the side walls 22 of the gate electrode 20 (FIG. 4A).

Figure 4B:
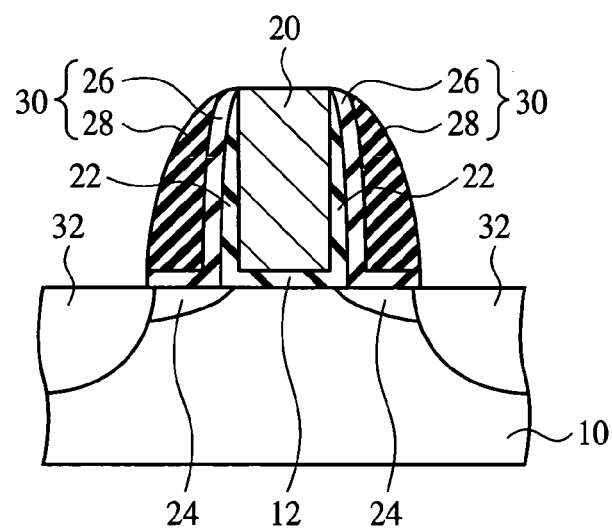

Next, with the gate electrode 20 and the sidewall insulating films 22, 30 as the mask, ion implantation is performed to form impurity regions 32 in the silicon substrate 10 on both sides of the gate electrode 20 (FIG. 4B).

Figure 4C:
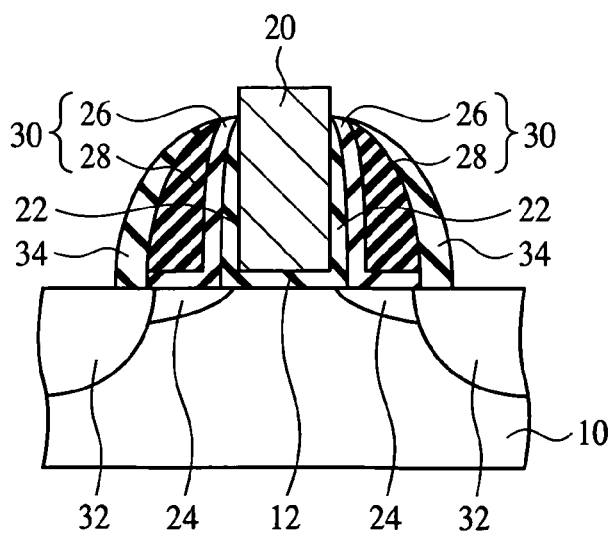

Next, a silicon oxide film of, e.g., a 50 nm-thickness is deposited by CVD method and etched back to form the sidewall insulating films 34 of the silicon oxide film on the side walls of the gate electrode 20 (FIG. 4C).

Next, with the gate electrode 20 and the sidewall insulating films 22, 30, 34 as the mask, impurity ions are implanted to form impurity regions 36 in the silicon substrate on both sides of the gate electrode 20.

Thus, the source/drain regions 38 of the impurity regions 24, 32, 36 of the gate electrodes 20 are formed.

Next, a 20 nm-thick nickel film, for example, is deposited on the entire surface by, e.g., sputtering method.

Next, thermal processing is conducted in, e.g., a nitrogen atmosphere, and e.g., at 300° C. for 3 minutes. This thermal treatment causes the silicidation reaction on the gate electrode 20 and the source/drain regions 38 where silicon is exposed, and the nickel silicide films 40 of, e.g., a 10 nm-thickness is formed on the gate electrode 20 and the source/drain regions 38.

Figure 5A:
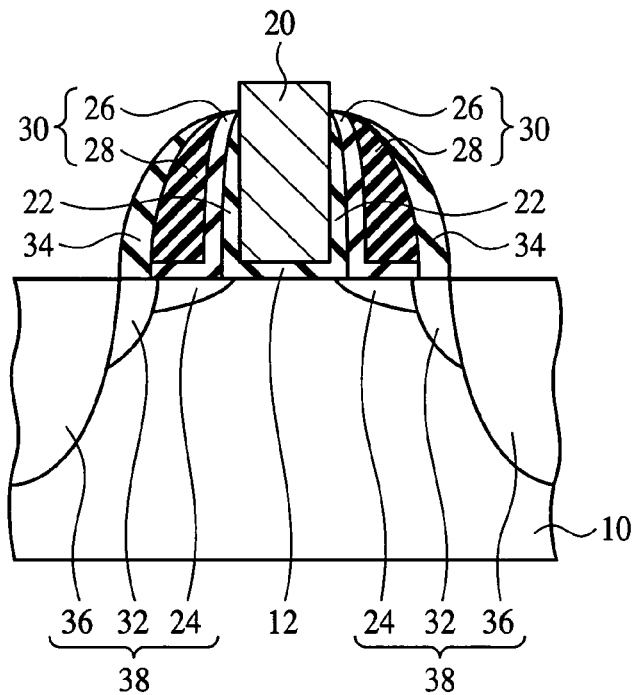
Figure 5B:
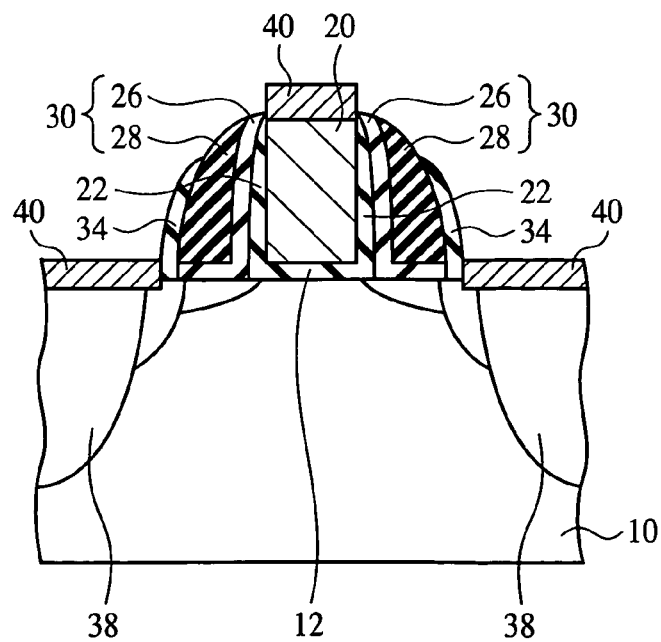

Next, unreacted nickel film is removed by wet etching using, e.g., SPM (sulfuric acid-hydrogen peroxide mixture liquid) (FIG. 5B).

The nickel silicide film 40 may be formed only on the source/drain regions 38 by first forming a mask film, such as silicon nitride film or others on the gate electrode 20.

In place of the nickel silicide film, another metal silicide film, such as titanium silicide, chrome silicide, cobalt silicide or others, may be used.

Figure 6A:
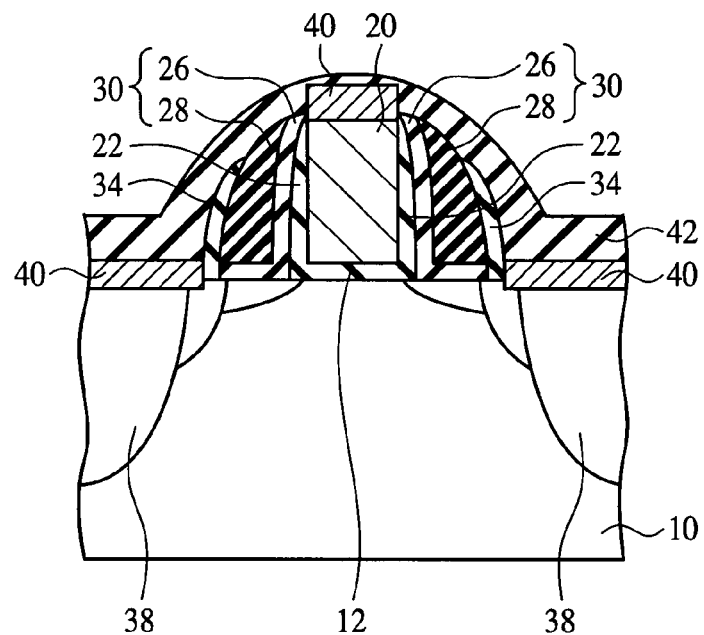

Then, a silicon oxide film 42 of, e.g., a 50 nm-thickness is deposited on the entire surface by, e.g., high density plasma CVD method (FIG. 6A). In forming the silicon oxide film 42, conditions for the film formation are set so that the silicon oxide film 42 has a sufficiently smaller film thickness on the gate electrode 20 than on the remaining surfaces (e.g., on the source/drain regions 38). The silicon oxide film 42 is formed, for example, at a 120 sccm SiH$_4$ flow rate, a 220 sccm O$_2$ flow rate, a 500 sccm-He flow rate, and at a power of LF (low frequency power)/HF (high frequency power)=3200 W/500 W, whereby the silicon oxide film 42 can have a smaller thickness on the gate electrode 20 than on the remaining surfaces.

In place of the silicon oxide film 42 deposited by high density plasma CVD method, a SOG film may be deposited by spin coating method. By spin coating method, in which an applied film flows in the direction where the film surface is flattened, the film thickness on the projected parts naturally becomes smaller than the film thickness on the flat part.

Figure 6B:
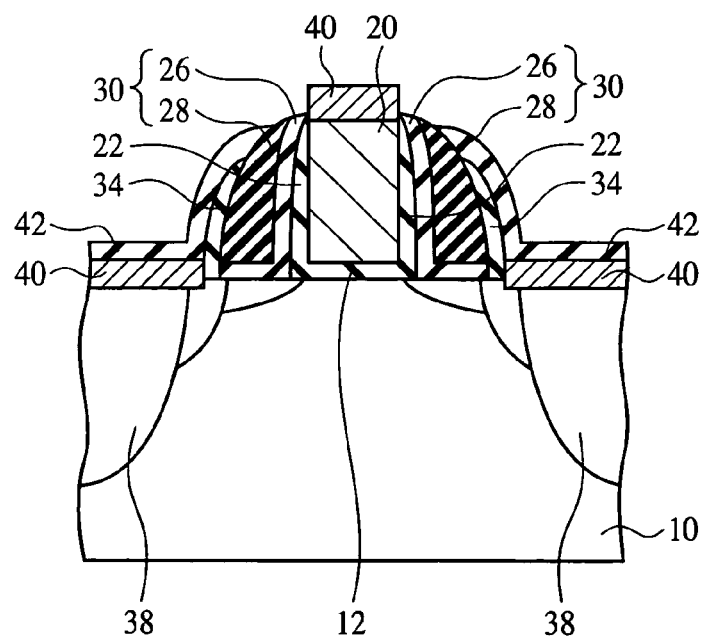

Then, the silicon oxide film 42 is anisotropically etched by, e.g., dry etching until the nickel silicide film 40 on the gate electrode 40 is exposed. At this time, the silicon oxide film 42 formed on the source/drain regions 38, which is sufficiently thicker than the silicon oxide film formed on the gate electrode 20, covers the nickel silicide film 40 on the source/drain regions even after the nickel silicide film on the gate electrode 20 has been exposed (FIG. 6B).

The nickel silicide film 40 on the gate electrode 20 may be removed when the silicon oxide film 42 is etched.

For the etching of the silicon oxide film 42, wet etching with a hydrofluoric acid-based aqueous solution may be used. In this case, the nickel silicide film 40 on the gate electrode 20 can be etched together with the silicon oxide film 42.

Next, a 30 nm-thick nickel film is deposited on the entire surface by, e.g., sputtering method.

Next, thermal processing is conducted in, e.g., a nitrogen atmosphere and, e.g., at 400° C. for 1 minute. This thermal processing advances the silicidation reaction between the gate electrode 20 and the nickel film from the upper surface of the gate electrode 20 and substitutes the entire gate electrode 20 up to the gate insulating film 12 into the nickel silicide. Thus, a gate electrode 44 of nickel silicide is formed.

At this time, because of the silicon oxide film 42 remaining on the source/drain regions 38, the silicidation reaction does not greatly advance in the source/drain regions 38. Accordingly, the inconvenience of the nickel silicide film 40 on the source/drain regions 38 greatly thickening, and thus causing junction breakage of the source/drain regions 38, etc. does not take place.

The silicidation reaction for substituting the gate electrode 20 into the nickel silicide advances from the upper surface of the gate electrode 20. When concavities and convexities are present in the surface of the polycrystalline silicon film 14, the silicidation reaction arrives at the gate insulating film 12 earlier in the concavities, and the silicidation reaction on the gate insulating film 12 becomes inhomogeneous. Resultantly, there is a risk that the gate insulating film 12 may be damaged (see FIG. 8A).

In contrast to this, in the method for fabricating the semiconductor device according to the present embodiment, the surface of the polycrystalline silicon film 14 is planarized in the step shown in FIG. 2B. Accordingly, the silicidation of the gate electrode 20 advances homogeneously from the upper surface of the gate electrode 20 (see FIG. 8B), and the gate insulating film 12 can be prevented from being damaged.

When the gate insulating film 12 is not much damaged or negligibly damaged by the silicidation reaction, or when amorphous silicon film is deposited in place of polycrystalline silicon film, the planarization by CMP in the step of FIG. 2B is not essential.

Figure 7A:
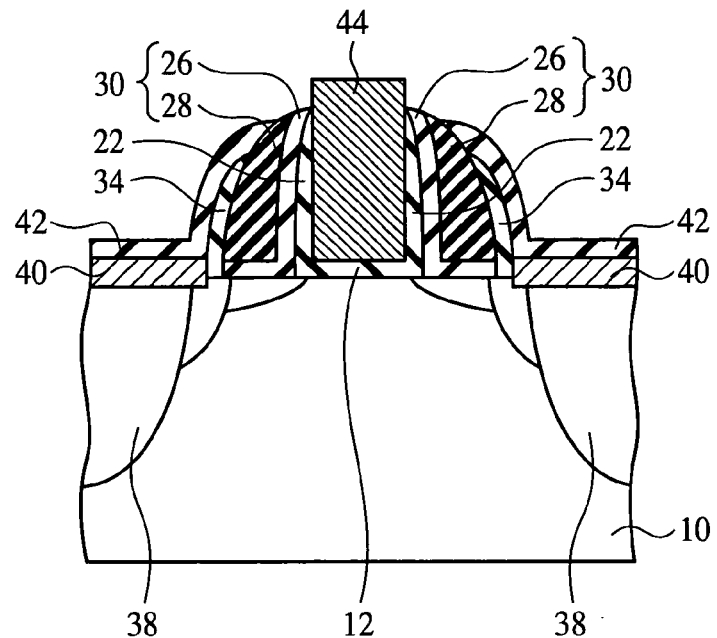

Next, unreacted nickel film is removed by wet etching using, e.g., SPM (sulfuric acid-hydrogen peroxide mixture liquid) (FIG. 7A).

Figure 7B:
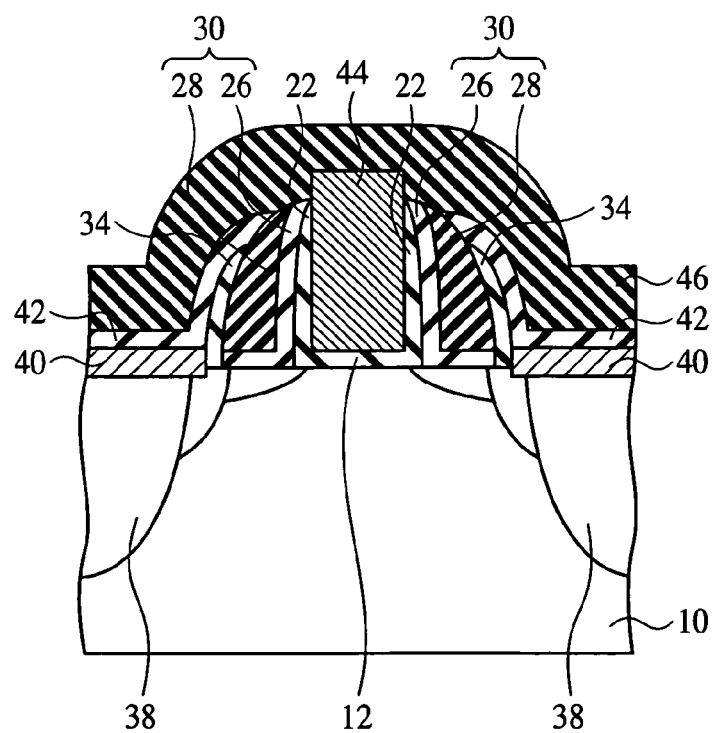

Then, a 100 nm-thick silicon nitride film, for example, is deposited on the entire surface to form the stressor film 46 (FIG. 7B). The stressor film 46 is formed, extended from the side walls of the gate electrode 44 onto the upper surface to cover the gate electrode 44, and can apply a required stress to the channel region.

The silicon nitride film as the stressor film 46 is deposited to have a 1.5 GPa tensile stress so as to apply the tensile stress to the channel region, for example, by LPCVD method at a 500° C. film forming temperature, a 60 sccm Si$_2$H$_6$ flow rate and a 5 slm NH$_3$ flow rate and under a 300 Torr pressure.

For the n-channel MISFET, a stressor film 46 having a tensile stress from about 1.0 to 2.0 GPa with respect to the silicon substrate 10 is effective to improve the mobility of the electrons in the channel, and for the p-channel MISFET, a stressor film 46 having a compression stress from about 1.0 to 3.0 GPa with respect to the silicon substrate is effective to improve the mobility of the holes in the channel. It is preferable to set conditions for forming the stressor film 46 suitably corresponding to sizes, kinds, required characteristics, etc. of the MISFET to be formed.

Next, the results of the measurements of the characteristics of the semiconductor device according to the present embodiment will be explained with reference to FIGS. 9 to 13.

FIG. 9 is a graph of the cumulative probability distributions of the junction leakage current of the source/drain regions of MISFETs. FIG. 10 is a graph of the cumulative probability distributions of the sheet resistance of the source/drain regions of the MISFETs. In the graphs, the ● marks indicate the n-channel MISFET according to the present embodiment, and the ○ marks indicate the p-channel MISFET according to the present embodiment. The ■ marks indicate a control in which an n-channel MISFET includes the conventional polycide gate, and the □ marks indicate a control in which a p-channel MISFET includes the conventional polycide gate.

As shown in FIG. 9, the n-channel MISFET according to the present embodiment has the junction leakage current a little increased in comparison with the n-channel MISFET of the conventional structure, but the p-channel MISFET according to the present embodiment has the junction leakage current decreased in comparison with the p-channel MISFET of the conventional structure. The values of the junction leakage current and the fluctuation are sufficiently within the negligible range in comparison with the conventional values.

As shown in FIG. 10, in the n-channel MISFET and the p-channel MISFET according to the present embodiment, the decreases of the sheet resistance are small in comparison with the MISFETs of the conventional structure. The values of the sheet resistance and the fluctuation are sufficiently within the negligible range in comparison with the conventional values.

These results show that in the thermal processing of substituting the gate electrode 20 with nickel silicide (the step of FIG. 7A), the degradation of the characteristics of the nickel silicide film 40 on the source/drain regions 38 (for example, the punch-through of the source/drain regions due to the silicidation reaction advancing, etc.) has not taken place.

FIG. 11 is a graph of the relationship between the maximum gate capacitance of MISFETs and the gate electrode length. In the graph, the ● marks indicate the p-channel MISFET according to the present embodiment. The ○ marks indicate the p-channel MISFET of the conventional polycide gate structure. The gate insulating film used in the measurement was a 1.2 nm-thickness silicon oxynitride film.

Based on the result of the measurement shown in FIG. 11, it is found that the inversion layer of the MISFET according to the present embodiment has a 1.5 nm-thickness, while the inversion layer of the MISFET of the polycide gate structure has a 2.0 nm-thickness. That is, in the MISFET according to the present embodiment, the depletion is suppressed by the complete silicidation of the gate electrode and the thickness of the inversion layer can be thinner by 0.5 nm than in the MISFET of the polycide gate structure.

FIG. 12 is a graph of the relationship between the maximum drive current of the n-channel MISFET and the minimum operation gate length of the MISFET. FIG. 13 is a graph of the relationship between the maximum drive current of the P-channel MISFET and the minimum operation gate length of the MISFET. In the graphs, the ● marks indicate the MISFET according to the present embodiment, and the ○ marks indicate the MISFET of the conventional polycide gate structure.

As shown in FIGS. 12 and 13, both the n-channel MISFET and the p-channel MISFET according to the present embodiment can have the minimum operation gate length at which the MISFET can operate shortened and also can have the maximum drive current increased.

As described above, according to the present embodiment, the pattern dependency of the deposited film thickness for the insulating film 42 is utilized to cover the MISFET thinner on the gate electrode and thicker on the remaining surfaces, whereby the upper part of the gate electrode can be selectively exposed without using a CMP process. This facilitates substituting the gate electrode into metal silicide. The stressor film formed after the gate electrode has been substituted into metal silicide is formed from the side walls of the gate electrode onto the upper surface thereof, whereby the stressor film can apply a required stress to the channel region.

Thus, the above described the present embodiment of a semiconductor device and method for fabricating the same, suppresses the depletion of the gate electrode, and gate resistance can therefore be decreased in comparison to the gate electrode of the polycide structure. A required stress can be applied to the channel region by the stressor film, whereby the mobility of carriers in the channel can be improved. Thus, the MISFET can be operated at high speed.

The surface of polycrystalline silicon film to be the gate electrode is planarized initially after it is deposited, whereby the gate insulating film is not damaged in the process of the silicidation reaction for substituting the gate electrode into the metal silicide.

The semiconductor device and the method for fabricating the same according to a second embodiment of the present invention will be explained with reference to FIGS. 14 to 16C. The same members of the present embodiment as those of the semiconductor device and the method for fabricating the same according to first embodiment shown in FIGS. 1 to 13 are represented by the same reference numbers. Additionally, method steps of fabrication which are the same for both embodiments are not repeated to simplify their explanation.

Figure 14:
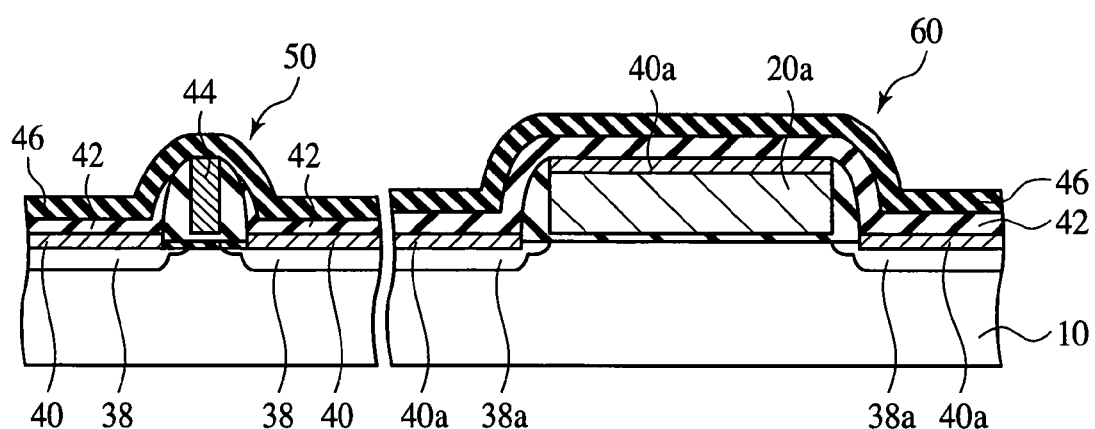
FIG. 14 is a diagrammatic sectional view of the semiconductor device according to a second embodiment of the present invention.

FIG. 14 is a diagrammatic sectional view of the semiconductor device according to the present embodiment, which shows a structure thereof. FIGS. 15A-15C and 16A-16C are sectional views of the semiconductor device according to the present embodiment in the steps of the method for fabricating the same, which show the method.

In the first embodiment described above, a MISFET including the gate electrode of metal silicide and the method for fabricating the same are described. However, it is sufficient for some semiconductor devices that only the gate electrodes of MISFETs of the logic circuit, etc., which require high speed operation, have silicide gates, and the other MISFETs have polycide gates or polycrystalline silicon gates. In the present embodiment, a semiconductor device comprising MISFETs including different gate electrode structures will be described.

First, the structure of the semiconductor device according to the present embodiment will be explained with reference to FIG. 14.

A MISFET 50 whose gate length is short and a MISFET 60 whose gate length is long are formed on a silicon substrate 10.

The MISFET 50 includes a gate electrode 44 of metal silicide formed over the silicon substrate with a gate insulating film interposed therebetween, and source/drain regions 38 formed in the silicon substrate 10 on both sides of the gate electrode 44. A nickel silicide film 40 is formed on the source/drain regions 38.

The MISFET 60 includes a gate electrode 20a of polycrystalline silicon formed over the silicon substrate 10 with the gate insulating film interposed therebetween, and source/drain regions 38a formed in the silicon substrate 10 on both sides of the gate electrode 20a. A nickel silicide film 40a is formed on the gate electrode 20a and the source/drain regions 38a.

A silicon oxide film 42 is formed on the nickel silicide film 40 formed on the source/drain regions 38 of the MISFET 50. The silicon oxide film 42 is not extended over the gate electrode 44 of the MISFET 50.

The silicon oxide film 42 is formed on the MISFET 60, covering the MISFET 60. That is, the silicon oxide film 42 is extended on the nickel silicide film 40a formed on the source/drain regions 38a and also on the nickel silicide film 40a formed on the gate electrode 20a.

A stressor film 46 is formed over the MISFETs 50, 60 with the silicon oxide film 42 formed on.

As described above, the semiconductor device according to the present embodiment includes the MISFET 50 whose gate length is short and the MISFET 60 whose gate length is long, the gate electrode 44 of the MISFET 50 is formed of metal silicide, and the gate electrode 20a of the MISFET 60 is a polycide. The stressor film 46 is formed from the side walls of the gate electrode 44 of the MISFET 50 onto the upper surface thereof.

A semiconductor device is thus constituted, whereby the gate resistance of the MISFET 50 with a short gate length (which is required to have high speed operation) can be decreased, and thus the mobility of carriers in the channel can be improved. Hence, the MISFET will operate at high speed. The MISFET 60 with long gate length (the entire gate electrode of which is not required to be silicidized) can have the polycide gate structure.

Next, the method for fabricating the semiconductor device according to the present embodiment will be explained with reference to FIGS. 15A to 16C.

Figure 15A:
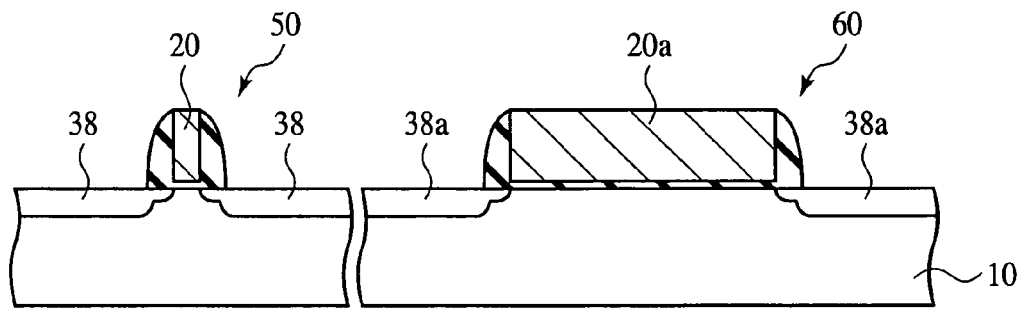
FIGS. 15A-15C and 16A-16C are sectional views of the semiconductor device according to the second embodiment of the present invention in the steps of the method for fabricating the same.

First, in the same way as in, e.g. the method for fabricating the semiconductor device according to the first embodiment shown in FIGS. 2A to 5A, over the silicon substrate 10, the MISFET 50 with short gate length including the gate electrode of polycrystalline silicon film and the source/drain regions 38 formed in the silicon substrate 10 on both sides of the gate electrode 20, and the MISFET 60 with long gate length including the gate electrode 20a of polycrystalline silicon film and the source/drain regions 38a formed in the silicon substrate 10 on both sides of the gate electrode 20a are formed (FIG. 15A).

Next, a 20 nm-thick nickel film, for example is deposited on the entire surface by, e.g., sputtering method.

Next, thermal processing is conducted in, e.g., a nitrogen atmosphere and, e.g., at 300° C. for 3 minutes. This thermal processing causes the silicidation reaction on the gate electrodes 20, 20a and the source/drain regions 38, 38a with silicon exposed, and the nickel silicide film 40, 40a of a 20 nm-thick is formed on the gate electrode 20, 20a and the source/drain regions 38, 38a.

Figure 15B:
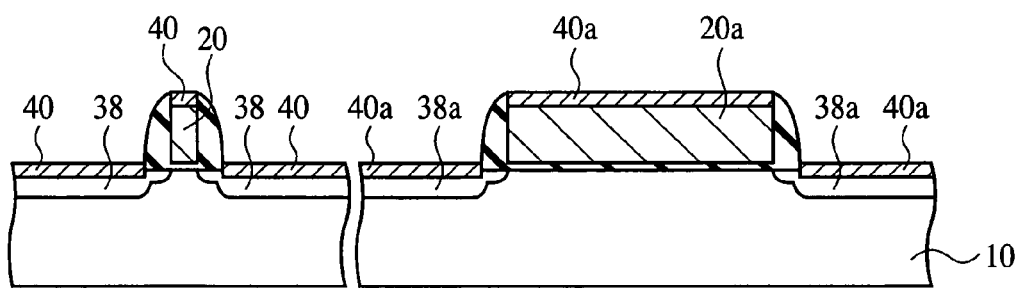

Next, the unreacted nickel film is removed by wet etching using, e.g., SPM (sulfuric acid-hydrogen peroxide mixture liquid) (FIG. 15B).

The nickel silicide film 40, 40a may be formed only on the source/drain regions 38a, 38a by forming a mask film of silicon nitride film or others on the gate electrode 20 and the gate electrode 20a.

In place of the nickel silicide film, another metal silicide film, such as titanium silicide, chrome silicide, cobalt silicide or others, may be formed.

Figure 15C:
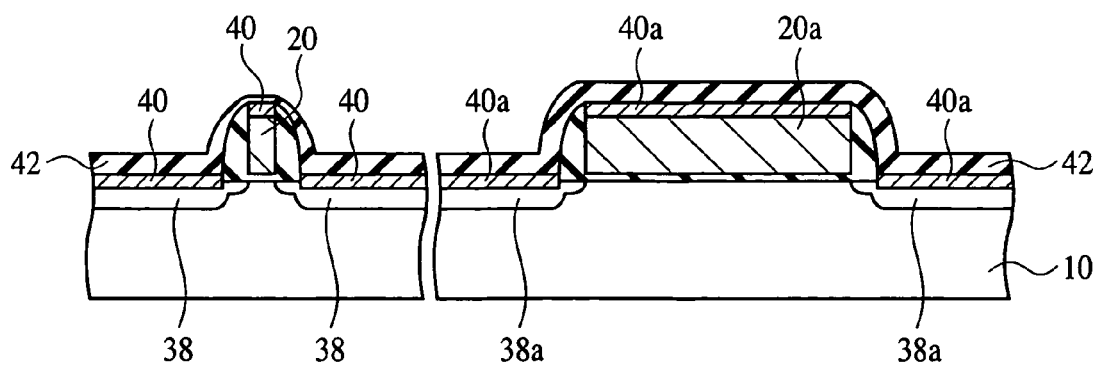

Then, the silicon oxide film 42 of, e.g., a 50 nm-thickness is deposited on the entire surface by, e.g., high density plasma CVD method (FIG. 15C). For the step of forming the silicon oxide film 42, conditions for the film formation are set so that the film thickness of the silicon oxide film 42 is sufficiently smaller on the gate electrode 20 than on the remaining surfaces (e.g., on the source/drain regions 38, 38a). The silicon oxide film 42 is formed under conditions of, e.g., a 120 sccm $SiH_4$ flow rate, a 220 sccm $O_2$ flow rate, a 500 sccm He flow rate and a power of LF (low frequency power)/HF (high frequency power)=3200 W/500 W, whereby the silicon oxide film 42 becomes thinner on the gate electrode 20 than on the remaining surfaces.

At this time, the film thickness of the silicon oxide film changes depending on the size of the base convexity (gate length). For example, when the gate length is not more than 0.1 µm, the film thickness on the electrode becomes smaller than that on the remaining surfaces, but when the gate length is not less than about 0.2 µm, the film thickness on the electrode becomes substantially equal to that on the remaining surfaces. Accordingly, the gate length of the gate electrode 20 is, e.g., 0.05 µm, and the gate length of the gate electrode 20a is 0.2 µm, whereby the film thickness of the silicon oxide film 42 on the gate electrode 20 becomes sufficiently smaller than the film thickness on the remaining surfaces (e.g., on the source/drain regions 38, 38a), and the film thickness of the silicon oxide film 42 on the gate electrode 20a becomes substantially equal to that on the remaining surfaces.

In place of depositing the silicon oxide film 42 by high density plasma CVD method, SOG film may be deposited by spin coating method. By spin coating method, in which an applied film flows in the direction where the film surface is flattened, the film thickness on the projected parts naturally becomes smaller than the film thickness on the flat surfaces.

Then, a photoresist film 48 which covers the region the MISFET 60 is to be formed in, and exposes the region for the MISFET 50 is to be formed in, is formed by photolithography.

Figure 16A:
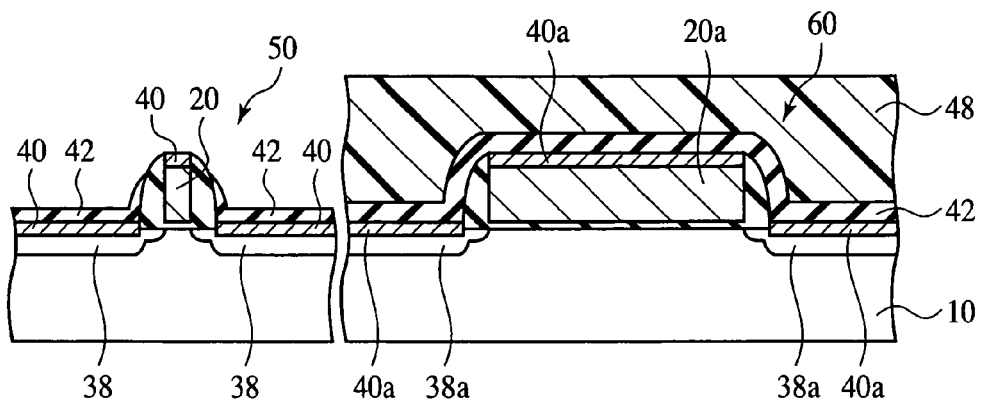

Next, dry etching is conducted with the photoresist film 48 as the mask to anisotropically etch the silicon oxide film 42 until the nickel silicide film 40 on the gate electrode 20 is exposed. At this time, the silicon oxide film 42, which is thicker on the source/drain regions 38 than on the gate electrode 20, still covers the nickel silicide film 40 on the source/drain regions 38 even after the nickel silicide film 40 on the gate electrode 20 has been exposed (FIG. 16A).

The nickel silicide film 40 on the gate electrode 20a may be removed when the silicon oxide film 42 is etched.

The silicon oxide film 42 may be etched by wet etching using a hydrofluoric acid-based aqueous solution. In this case, the nickel silicide film 40 can be removed together with the silicon oxide film 42.

Next, the photoresist film 48 is removed by, e.g., ashing.

The photoresist film 48 is not essentially formed when the silicon oxide film 42 on the gate electrode 20 is thin enough for the upper surface of the gate electrode 20 to be selectively exposed without forming the photoresist film 48.

Next, a 30 nm-thick nickel film, for example, is deposited on the entire surface by, e.g., sputtering method.

Then, thermal processing is conducted in, e.g., a nitrogen atmosphere and, e.g., at 400° C. for 1 minute. This thermal processing advances the silicidation reaction between the gate electrode 20 and the nickel film and substitutes the entire gate electrode 20 up to the gate insulating film 12 into nickel silicide. Thus, a gate electrode 44 of nickel silicide is formed.

At this time, because of the silicon oxide film 42 remaining on the gate electrode 20a and on the source/drain regions 38, 38a, the silicidation reaction does not advance on the gate electrode 20a and the source/drain regions 38, 38a.

Figure 16B:
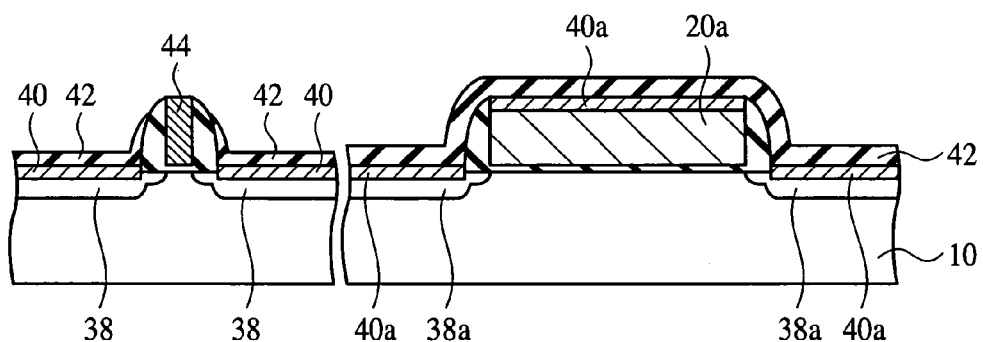

Next, the unreacted nickel film is removed by wet etching using, e.g., SPM (sulfuric acid-hydrogen peroxide mixture liquid) (FIG. 16B).

Figure 16C:
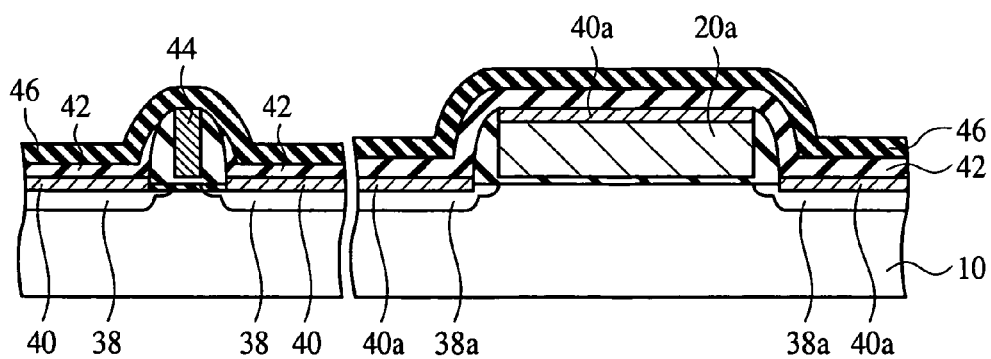

Then a 100 nm-thick silicon nitride film, for example, is deposited on the entire surface to form a stressor film 46 of silicon nitride (FIG. 16C). The stressor film 46 is formed over the gate electrode 44 from the side walls thereof onto the upper surface thereof, and can apply a required stress to the channel region of the MISFET 50.

As described above, according to the present embodiment, the pattern dependency of the deposited film thickness for the insulating film is utilized to cover the MISFETs thinner on the gate electrode of the MISFET with short gate length and thicker on the gate electrode of the MISFET with long gate length. Therefore, the upper part of the gate electrode of the MISFET with short gate length can be selectively exposed without using a CMP process.

Accordingly, the gate electrode of a MISFET with short gate length, which is required to have high operation speed, can be formed of metal silicide without complicating the fabrication steps, and a MISFET with long gate length, which does not require metal silicide gate, may have the polycide gate.

The method for fabricating the semiconductor device and the method for designing a semiconductor device according to the present embodiment agree with the semiconductor device including a stressor film according to the first embodiment and the method for fabricating the same and can produce the advantageous effect of the stressor film.

The semiconductor device and the method for fabricating the same according to a third embodiment of the present invention will be explained with reference to FIGS. 17 to 22. The same members of the present embodiment as those of the semiconductor device according to the first and the second embodiment and the method for fabricating the semiconductor device illustrated in FIGS. 1 to 16C are represented by the same reference numbers not to repeat or to simplify their explanation.

Figure 17:
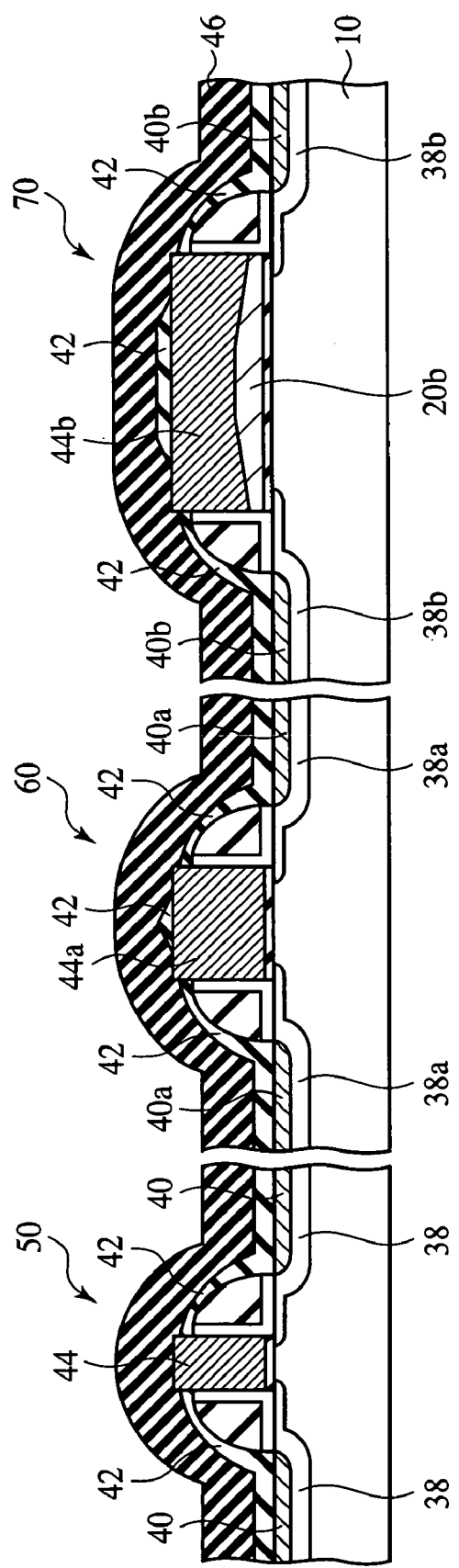
FIG. 17 is a diagrammatic sectional view of the semiconductor device according to a third embodiment of the present invention.
Figure 21:
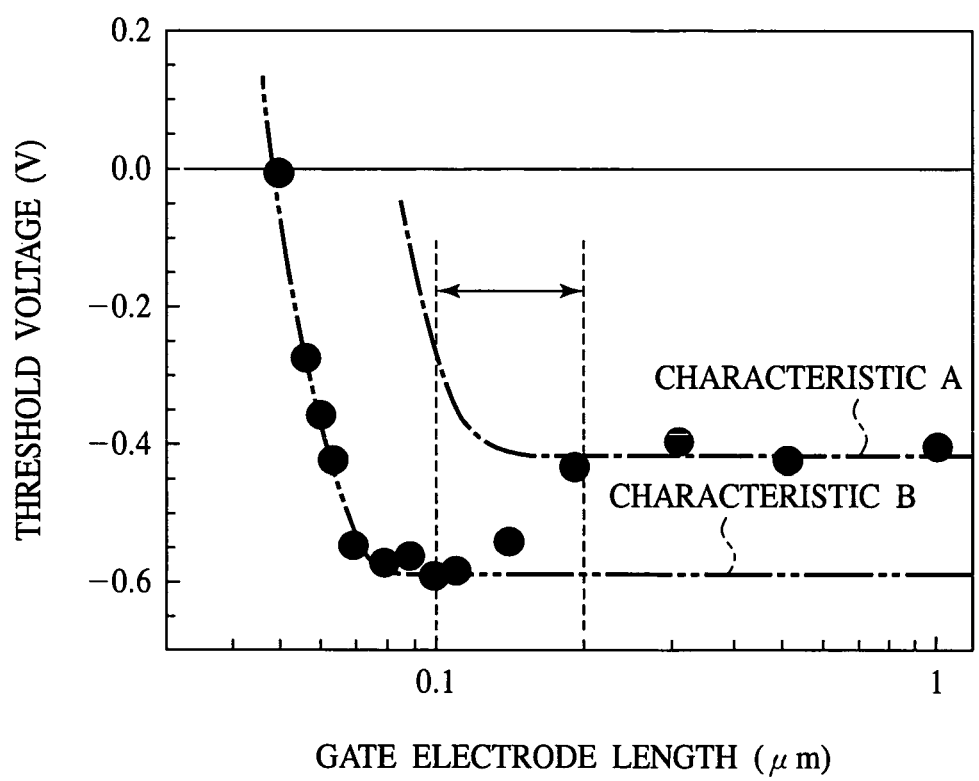
FIG. 21 is a graph showing the relationship between the threshold voltage and the gate length of the p-channel MISFET of the semiconductor device according to the third embodiment of the present invention.
Figure 22:
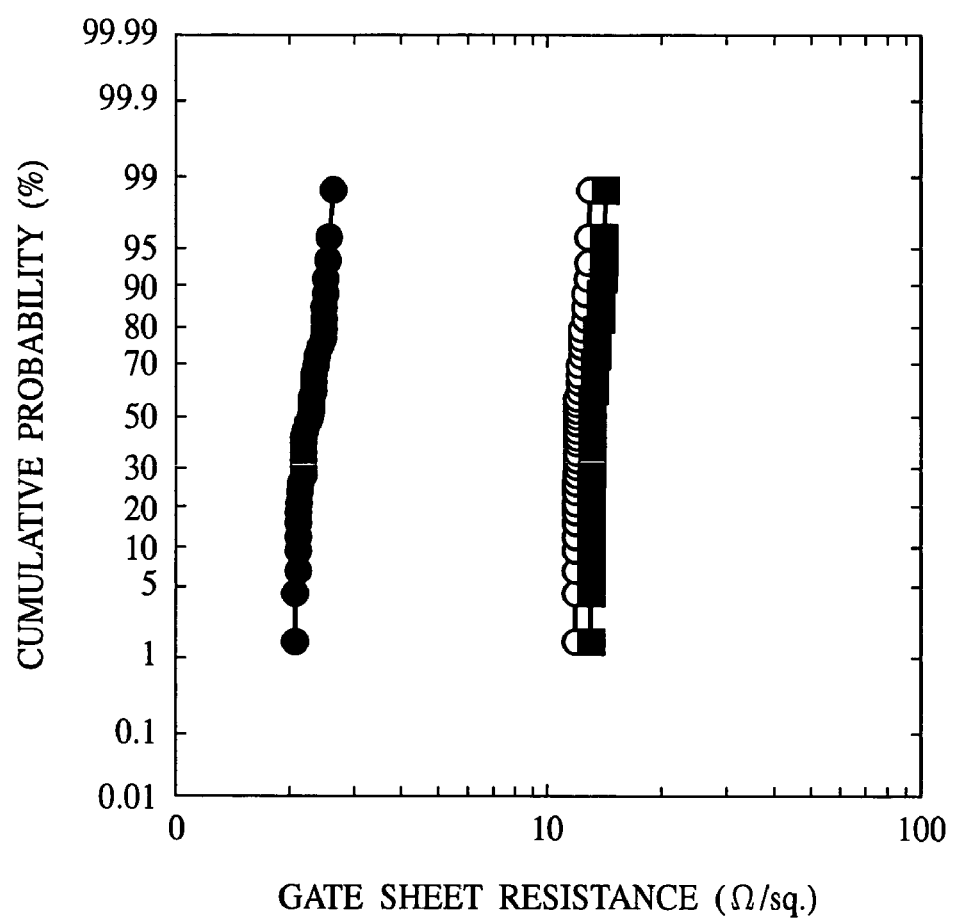
FIG. 22 is a graph showing the cumulative frequency distributions of the gate sheet resistance of the semiconductor device according to the third embodiment of the present invention.

FIG. 17 is a diagrammatic sectional view of the semiconductor device according to the present embodiment, which shows a structure thereof. FIGS. 18A-18B, 19A-19B and 20A-20B are sectional views of the semiconductor device according to the present embodiment in the steps of the method for fabricating the same, which show the method. FIG. 21 is a graph of the relationship between the threshold voltage of the p-channel MISFET of the semiconductor device according to the present embodiment and the gate length. FIG. 22 is a graph of the cumulative probability distributions of the gate sheet resistance of the semiconductor device according to the present embodiment.

The semiconductor device according to the present embodiment comprises MISFETs of different gate electrode structures, as does the second embodiment.

First, the structure of the semiconductor device according to the present embodiment will be explained with reference to FIG. 17.

A MISFET 50, a MISFET 60 having a longer gate length than the MISFET 50, and a MISFET 70 having a longer gate length than the MISFET 60 are formed over a semiconductor substrate 10.

The MISFET 50 comprises a gate electrode 44 of metal silicide formed over the silicon substrate 10 with a gate insulating film interposed therebetween, and source/drain regions 38 formed in the silicon substrate 10 on both sides of the gate electrode 44. A nickel silicide film 40 is formed on the source/drain regions 38.

The MISFET 60 comprises a gate electrode 44a of metal silicide formed over the silicon substrate 10 with the gate insulating film interposed therebetween, and source/drain regions 38a formed in the silicon substrate 10 on both sides of the gate electrode 44a. The nickel silicide film 40a is formed on the source/drain regions 38a.

The MISFET 70 comprises a gate electrode 20b formed over the silicon substrate 10 with the gate insulating film interposed therebetween, and source/drain regions 38b formed in the silicon substrate 10 on both sides of the gate electrode 20b. The nickel silicide film 44b, 40b is formed respectively on the gate electrode 20b and the source/drain regions 38b.

A silicon oxide film 42 is formed on the nickel silicide film 40 formed on the source/drain regions 38 of the MISFET 50. The silicon oxide film 42 is not extended over the gate electrode 44 of the MISFET 50.

The silicon oxide film 42 is formed on the nickel silicide film 40a formed on the source/drain regions 38a of the MISFET 60. The silicon oxide film 42 is formed on the central part of the gate electrode 44a, but the end of the gate electrode 44a is not covered with the silicon oxide film 42.

The silicon oxide film 42 is formed on the nickel silicide film 40b formed on the source/drain regions 38b of the MISFET 70. The silicon oxide film 42 is formed on the central part of the nickel silicide film 44b formed on the gate electrode 20b, but the end of the nickel silicide film 44b is not covered with the silicon oxide film 42.

A stressor film 46 is formed over the MISFETs 50, 60, 70 with the silicon oxide film 42 formed on.

As described above, the semiconductor device according to the present embodiment comprises the MISFETs 50, 60, 70 having different gate lengths, and has the gate electrode 44 of the MISFET 50 and the gate electrode 44a of the MISFET 60 formed of metal silicide and the gate electrode 20b of the MISFET 70 formed of polycide gate.

The semiconductor device is so constituted, whereby the MISFETs 50, 60 having shorter gate length, which are required to operate at high speed, can have the sheet resistance decreased and the mobility of the carriers in the channels increased. Thus, the MISFETs can operate at high speed. The MISFET 70, all the gate electrode of which is not required to be silicidized and which has a longer gate length, can have the polycide gate structure.

Next, the method for fabricating the semiconductor device according to the present embodiment will be explained with reference to FIGS. 18A to 20B.

First, in the same way as in the method for fabricating the semiconductor device according to, e.g., the first embodiment shown in FIGS. 2A to 5B, over the silicon substrate 10, the MISFET 50 including the gate electrode 20 of polycrystalline silicon film, the source/drain regions 38 formed in the silicon substrate 10 on both sides of the gate electrode 20 and the nickel silicide film 40 formed on the gate electrode 20 and the source/drain regions 38, the MISFET 60 including the gate electrode 20a of polycrystalline silicon film, the source/drain regions 38a formed in the silicon substrate 10 on both sides of the gate electrode 20a and the nickel silicide film 40a formed on the gate electrode 20a and the source/drain regions 38a, and the MISFET 70 including the gate electrode 20b of polycrystalline silicon film, the source/drain regions 38b formed in the silicon substrate 10 on both sides of the gate electrode 20b and the nickel silicide film 40b formed on the gate electrode 20b and the source/drain regions 38b (FIG. 18A).

Here, the gate length of the MISFET 50 is, e.g., 30 nm, the gate length of the MISFET 60 is, e.g., 110 nm, and the gate length of the MISFET 70 is, e.g., 300 nm.

Then, the silicon oxide film 42 is deposited on the entire surface in, e.g., a 10-40 nm-thickness by, e.g., high density plasma CVD method (FIG. 18B). The silicon oxide film 42 is formed under the conditions of, e.g., a 120 sccm $SiH_4$ flow rate, a 220 sccm $O_2$ flow rate, a 500 sccm He flow rate and a power of LF (low frequency power)/HF (high frequency power)=3200 W/500 W.

The silicon oxide film 42 formed by the high-density plasma CVD method has a smaller deposited film thickness at the steps than at the flat parts. That is, as shown in FIG. 18B, the film thickness of the silicon oxide film 42 is generally smaller over the gate electrode 20, whose gate length is shorter, than the flat parts, and over the gate electrodes 20a, 20b, whose gate lengths are longer, is smaller near the ends than at the central parts and the flat parts.

Then, the silicon oxide film 42 is anisotropically etched by, e.g., dry etching until the nickel silicide film 40 over the gate electrode 20 is exposed. At this time, the silicon oxide film 42, which has been formed over the nickel silicide film 40a, 40b over the gate electrode 20a, 20b thicker at the central parts, is left at the central parts, while the nickel silicide film 40a, 40b is exposed at the upper ends. The silicon oxide film 42, which has been formed sufficiently thicker over the source/drain regions 38, 38a, 38b than over the gate electrode 20, covers the nickel silicide film 40, 40a, 40b over the source/drain regions 38, 38a, 38b after the nickel silicide film 40 on the gate electrode 20 is exposed (FIG. 19A). The anisotropic etching of the silicon oxide film 42 is made by, e.g., 4-30 seconds of sputter etching using, e.g., $Ar^+$ ions. The processing conditions are optimized suitably depending on the film thickness, film quality, etc. of the silicon oxide film 42.

In place of the sputter etching, the well-controlled dry etching may be used.

As described above, in the method for fabricating a semiconductor device according to the present embodiment, the silicon oxide film 42 can be left in different states by utilizing the different gate lengths without additionally using masks.

Then, a nickel film 48 of, e.g., a 40-70 nm-thickness is deposited on the entire surface by, e.g., sputtering method (FIG. 19B).

Next, thermal processing is made in, e.g., a nitrogen atmosphere, e.g., at 400° C. for 10-120 seconds. In the MISFET 50, this thermal processing advances the silicidation reaction between the gate electrode 20 and the nickel film 48 from the side of the upper surface, and all the gate electrode 20 to the gate insulating film 12 is substituted with nickel silicide. Thus the gate electrode 44 of nickel silicide is formed.

In the MISFET 60, the silicidation reaction between the gate electrode 20a and the nickel film 48 advances from the upper corners of the gate electrode 20a, and all the gate electrode 20a to the gate insulating film 12 is substituted with nickel silicide. Thus the gate electrode 44a of nickel silicide is formed.

In the MISFET 70, the silicidation reaction between the gate electrode 20*b* and the nickel film 48 advances from the upper corners of the gate electrode 20*b*, and the substantially upper half of the gate electrode 20*b* is substituted with the nickel silicide film 44*b*. Thus, the gate electrode 20*b* of the polycide structure with the nickel silicide film 44*b* formed on the top is formed (FIG. 20A).

At this time, because of the silicon oxide film 42 left on the source/drain regions 38, 38*a*, 38*b*, the silicidation reaction does not advance in the source/drain regions 38, 38*a*, 38*b*.

Here, the method for fabricating a semiconductor device according to the present embodiment is characterized mainly in that the gate lengths of the MISFETs 50, 60, 70 are so set that the gate electrodes of the respective MISFETs can have required structures.

FIG. 21 is a graph of one example of the relationships between the threshold voltage and the gate length of the p-channel MISFET having the gate electrode substituted with the nickel silicide under the above-described fabrication conditions.

The semiconductor device according to the present embodiment used in the measurement of FIG. 21 has the threshold voltage substantially constant with a gate length of not less than about 200 nm. With a gate length of not more than about 200 nm, the absolute value of the threshold voltage is once increased. With a gate length of not more than about 120 nm, the absolute value of the threshold voltage is decreased.

In the semiconductor device according to the present embodiment, the relationship between the threshold voltage and the gate length is different from the usual threshold roll-off characteristics, because the gate electrode of the polycide gate structure is formed in the region of the gate length of not less than about 200 nm, and in the region of the gate length of not more than about 120 nm, the gate electrodes of the silicide gate structure are formed. That is, in the region of the gate length of not less than above 200 nm, the threshold voltage roll-off characteristics of the polycide gate transistors (Characteristic A in the graph) is dominant, and in the region of the gate length of not more than about 120 nm, the threshold voltage roll-off characteristics of the silicide gate transistor (Characteristic B in the graph) is dominant.

The region of the about 200-120 nm gate length is the transient region from the polycide gate transistor to the silicide gate transistor, and it is difficult to form the transistors of stable characteristics in this region. In designing the semiconductor device, it is preferable that this transient region is a use prohibited region, and the MISFETs do not have the gate length of this region. The semiconductor device is thus designed, whereby both the polycide gate transistor (MISFET 70) and the silicide gate transistors (MISFETs 50, 60) can be stably fabricated.

The gate length of the use prohibited region changes depending on the fabrication conditions (conditions for forming and etching the silicon oxide film 42, and the film thickness of the metal film deposited in substituting the gate electrodes with metal silicide, thermal processing conditions, etc). Accordingly, it is preferable to set the gate length of the use prohibition region corresponding to the conditions for the fabrication process to be used. For example, in the method for fabricating the semiconductor device according to the present embodiment, when the film thickness of the nickel film 48 was changed to 10-30 nm, and the thermal processing conditions for substituting the gate electrodes with silicide was changed to a nitrogen atmosphere, 400° C. and 10-120 seconds, the gate length of the use prohibition region was 70-150 nm.

FIG. 22 is a graph of the cumulative probability distributions of the gate sheet resistance of the semiconductor device according to the present embodiment. In the graph, the ● marks indicate the case that the gate length is 110 nm, and the ○ marks indicate the case that the gate length is 10 μm. The ■ marks indicate a control having the conventional polycide gate.

As shown in the graph, the case with the gate length of 110 nm, the gate sheet resistance is lower by about 1 placement in comparison with the control with the conventional polycide gate structure, which shows that the gate electrode is completely silicidized. The case with the gate length of 300 nm has substantially the same gate sheet resistance as the control with the conventional polycide gate structure, which shows that the gate electrode is not completely silicidized. The fluctuation range of the gate sheet resistance is substantially the same as that of the control with the conventional gate structure, which shows that the polycide gate transistor and the silicide gate transistor can stably formed.

The above-described transient region from the polycide gate transistor to the silicide gate transistor is due to one factor that when the step of planarizing the polycrystalline silicon film 14 shown in FIG. 2B is not used in the method for fabricating the semiconductor device according to the first embodiment, the fluctuation of the arrival of the nickel silicide film 44 at the gate insulating film 12 due to the steps on the surface of the polycrystalline silicon film 14. In other words, the influence of the fluctuation of the film thickness due to the steps on the surface of the polycrystalline silicon film 14 can be prevented by the use prohibited region of the gate length. Accordingly when the use prohibited region of the gate length is provided, the influence of the surface steps on the fluctuation of the film thickness can be prevented even without planarizing the polycrystalline silicon film 14 by CMP.

Then, the nickel film 46 which has not reacted is removed by wet etching using, e.g., SPM (sulfuric acid-hydrogen peroxide mixture liquid).

Then, a silicon nitride film of, e.g., a 100 nm-thickness is deposited on the entire surface to form the stressor film 46 of the silicon nitride film (FIG. 20B). The stressor film 46 is formed, extended from the side wall of the gate electrode 44 onto the upper surface to cover the gate electrode 44, whereby the stressor film 46 can apply a prescribed stress to the channel region of the MISFET 50. It is preferable to set conditions for forming the stressor film 46 suitably corresponding to sizes, kinds, required characteristics, etc. of the MISFET to be formed.

As described above, according to the present embodiment, the pattern dependency of the deposited film thickness in depositing the insulating film is utilized to form the insulating film with the upper ends of the gate electrodes selectively exposed, and from the upper ends, the substitution of the polycrystalline silicon forming the gate electrodes with the metal silicide is started, whereby the different gate lengths are utilized to thereby substitute all the gate electrodes of the MISFETs having short gate lengths and substitute a part of the gate electrode of the MISFET having a long gate length.

Accordingly, without making the fabrication steps complicated, the gate electrodes of the MISFETs having short gate lengths which are required to operate at high speed can be formed of metal silicide, and the MISFET having a long gate length which is not required to be metal silicidized can have the polycide gate.

In the silicidation step of substituting the gate electrodes with metal silicide, a maximum gate length which allows the gate electrodes to be stably and completely silicidized and a minimum gate length which allows the gate electrode to stably have the polycide gate structure are defined, and MISFETs having gate lengths which are between the maximum gate length and the minimum gate length are prohibited to be used, whereby without adding masks, the MISFETs having the gate electrodes completely silicidized and the MISFET having the gate electrode of the polycide structure can be stably formed.

The method for fabricating the semiconductor device and the method for designing a semiconductor device according to the present embodiment agree with the semiconductor device including a stressor film according to the first embodiment and the method for fabricating the same and can produce the advantageous effect of the stressor film.

The present invention is not limited to the above-described embodiments and can cover other various modifications.

For example, in the first and the second embodiments described above, the metal silicide film 40, 40a on the gate electrodes 20, 20a and the source/drain regions 38, 38a is formed by salicide (self-aligned silicide) process. However, the metal silicide film 40, 40a may not be formed.

In the above-described embodiments, the stressor film 46 of the silicon nitride film is formed on the silicon oxide film 26. However, one or more insulating films may be formed between the silicon oxide film 26 and the stressor film 46. For example, as shown in FIG. 12, the silicon oxide film 70 may be formed between the silicon oxide film 26 and the stressor film 46. The silicon oxide film 70 may be formed over the upper surface of the gate electrode 20. The silicon oxide film 70 is for, e.g., an etching stopper film for preventing the gate electrode 20 of the metal silicide film from being damaged when the stressor film 46 is etched to form the contact hole (not shown) reaching the gate electrode 20.

In the above-described embodiments, the sidewall insulating films 22, 30, 34 are formed in 3 stages, and the source/drain regions are formed of the impurity layers 24, 32, 36. However, the structures of the sidewall insulating film and the source/drain regions are not limited thereto.

For example, in the above-described embodiments, although the impurity layer 24 to be the extension region is formed immediately after the formation of the sidewall insulating film 22, the impurity layer may be formed immediately after the patterning of the polycrystalline silicon film 14 (after the step shown in FIG. 3A). Ion implantation may be conducted at the both steps immediately after the formation of the sidewall insulating film 22 and immediately after the patterning of the polycrystalline silicon film 14 to form the impurity layer 24 to be the extension region.

The source/drain regions may be formed of one impurity region or may have an LDD structure or extension structure. Pocket regions may be provided between the channel region and the source/drain regions. Preferably, the structure of the sidewall insulating film is set suitably in accordance with a structure of the source/drain regions and other requirements.

In the above-described embodiments, gate pre-doping impurities may be implanted in the polycrystalline silicon film 14 deposited on the gate insulation film 12.

What is claimed is:

1. A method for fabricating a semiconductor device comprising:

forming over a semiconductor substrate a first MISFET including first source/drain regions formed in the semiconductor substrate with a first channel region between them, and a first gate electrode of a polycrystalline silicon formed over the first channel region with a first gate insulation film interposed therebetween, and a second MISFET including second source/drain regions formed in the semiconductor substrate with a second channel region between them, and a second gate electrode formed over the second channel region with a second gate insulation film interposed therebetween, formed of a polycrystalline silicon and having a gate length larger than a gate length of the first gate electrode;

forming over the semiconductor substrate with the first MISFET and the second MISFET, a thickness of the first insulating film on an upper surface of the first gate electrode and an upper surface of the second gate electrode being thinner than a thickness of the first insulating film on the first source/drain regions and the second source/drain regions;

etching the first insulating film without using a mask, being left on the whole first source/drain regions and the whole second source/drain regions and exposing at least a part of the upper surface of the first gate electrode and a part of the upper surface of the second gate electrode so as to satisfy a relationship of (S1b/S1a)>(S2b/S2a), wherein S1a is an area of the upper surface of the first gate electrode, S1b is an area of the upper surface of the first gate electrode where the first insulating film is removed, S2a is an area of the upper surface of the second gate electrode and S2b is an area of the upper surface of the second gate electrode where the first insulating film is removed; and after etching the first insulating film, depositing a metal film over the exposed upper surface of the first gate electrode and the exposed upper surface of the second gate electrode, and making a thermal processing to substitute the polycrystalline silicon forming the first gate electrode and the polycrystalline silicon forming the second gate electrode with a metal silicide, wherein in the substituting the polycrystalline silicon with the metal silicide, the polycrystalline silicon forming the first gate electrode being totally substituted with the metal silicide and a part of the polycrystalline silicon forming the second gate electrode being substituted with the metal silicide.

2. The method for fabricating a semiconductor device according to claim 1, wherein a maximum gate length which allows a gate electrode of a metal silicide to be stably formed and a minimum gate length which allows a gate electrode of a polycide structure to be stably formed by the thermal processing for substituting the polycrystalline silicon with the metal silicide are defined, wherein in the forming the first MISFET and the second MISFET, the first MISFET is formed to have the first gate electrode of the gate length of not more than the maximum gate length, and the second MISFET is formed to have the second gate electrode of the gate length of not less than the minimum gate length.

3. The method for fabricating a semiconductor device according to claim 1, wherein the first MISFET is an n-channel MISFET, and which the method further comprises, after the substituting the polycrystalline silicon with the metal silicide: forming a second insulating film over the first gate electrode from side walls of the first gate electrode to an upper surface of the first gate electrode and having a tensile stress from 1.0 to 2.0 GPa.

4. The method for fabricating a semiconductor device according to claim 1, wherein the first MISFET is a p-channel MISFET, and which the method further comprises, after the step of substituting the polycrystalline silicon with the metal silicide: forming a second insulating film over the first gate electrode from side walls of the first gate electrode to an upper surface of the first gate electrode and having a compression stress from 1.0 to 3.0 GPa.

5. The method for fabricating a semiconductor device according to claim 1, wherein the forming the first MISFET and the second MISFET comprises:
    forming the first and the second gate insulating films and a polycrystalline silicon film over the semiconductor substrate;
    polishing a surface of the polycrystalline silicon film flat; and
    patterning the polycrystalline silicon film to form the first and the second gate electrodes.

6. The method for fabricating a semiconductor device according to claim 1, further comprising, after forming the first MISFET and the second MISFET and before forming the first insulating film:
    forming a metal silicide film on surfaces of the first source/drain regions and the second source/drain regions.

7. The method for fabricating a semiconductor device according to claim 6, wherein
    the metal silicide film is formed also on the first gate electrode and the second gate electrode.

8. The method for fabricating a semiconductor device according to claim 1, wherein
    the first insulating film comprises silicon oxide formed by high density plasma CVD or spin coating.

9. The method for fabricating a semiconductor device according to claim 1, wherein
    in the etching the first insulating film, the first insulating film is etched by sputter etching or dry etching.

10. The method for fabricating a semiconductor device according to claim 1, wherein
    the metal silicide is nickel silicide.

11. The method for fabricating a semiconductor device according to claim 1 further comprising:
    before forming the first MISFET and the second MISFET,
        defining a maximum gate length which allows a gate electrode of a metal silicide to be stably formed and a minimum gate length which allows a gate electrode of a polycide structure to be stably formed,
        designing a gate length of the first gate electrode to be a size of not more than the maximum gate length, and a gate length of the second gate electrode to be a size of not less than the minimum gate length, and
        prohibiting a gate length between the maximum gate length and the minimum gate length to be used.

12. The method for fabricating a semiconductor device according to claim 1, wherein
    in the thermal processing, the polycrystalline silicon forming the first gate electrode is fully transformed to the metal silicide, and a part of the polycrystalline silicon forming the second gate electrode is transformed to the metal silicide and other part of the polycrystalline silicon forming the second gate electrode is remained as the polycrystalline silicon.

13. The method for fabricating a semiconductor device according to claim 1, wherein
    in etching the first insulating film, a top surface of the first gate electrode is fully exposed, and a part of a top surface of the second gate electrode is exposed and other part of the top surface of the second gate electrode is covered with the first insulating film.

* * * * *